(12) United States Patent
Wong et al.

(10) Patent No.: US 10,784,880 B2
(45) Date of Patent: Sep. 22, 2020

(54) ULTRA-HIGH SPEED DIGITAL-TO-ANALOG (DAC) CONVERSION METHODS AND APPARATUS HAVING SUB-DAC SYSTEMS FOR DATA INTERLEAVING AND POWER COMBINER WITH NO INTERLEAVING

(71) Applicant: Jariet Technologies, Inc., Redondo Beach, CA (US)

(72) Inventors: Ark-Chew Wong, Irvine, CA (US); Richard Dennis Alexander, Lake Forest, CA (US); Craig A. Hornbuckle, Rolling Hills Estates, CA (US)

(73) Assignee: Jariet Technologies, Inc., Redondo Beach, CA (US)

( * ) Notice: Subject to any disclaimer, the term of this patent is extended or adjusted under 35 U.S.C. 154(b) by 0 days.

(21) Appl. No.: 16/623,755

(22) PCT Filed: Jul. 5, 2018

(86) PCT No.: PCT/US2018/040881
§ 371 (c)(1),
(2) Date: Dec. 17, 2019

(87) PCT Pub. No.: WO2019/010280
PCT Pub. Date: Jan. 10, 2019

(65) Prior Publication Data
US 2020/0220551 A1 Jul. 9, 2020

Related U.S. Application Data

(60) Provisional application No. 62/528,921, filed on Jul. 5, 2017.

(51) Int. Cl.
*H03M 1/66* (2006.01)
*H03M 1/06* (2006.01)
(Continued)

(52) U.S. Cl.
CPC ............ *H03M 1/0626* (2013.01); *H03M 1/00* (2013.01); *H03M 1/66* (2013.01); *H03M 1/747* (2013.01)

(58) Field of Classification Search
CPC ........... H03M 1/747; H03M 1/00; H03M 1/66
(Continued)

(56) References Cited

U.S. PATENT DOCUMENTS

| | | | |
|---|---|---|---|
| 9,350,377 B1 * | 5/2016 | Fetche | ................ H03M 1/0624 |
| 2013/0099951 A1 | 4/2013 | Kopa | |
| 2015/0318864 A1 | 11/2015 | Waltari | |

FOREIGN PATENT DOCUMENTS

CN 106341134 A 1/2017

* cited by examiner

*Primary Examiner* — Joseph J Lauture
(74) *Attorney, Agent, or Firm* — Morgan, Lewis & Bockius LLP

(57) ABSTRACT

A ultra-high speed DAC apparatus (e.g., with a full sampling frequency not less than 20 GHz) may include one or more digital pre-coders and DAC modules. Each DAC module may include multiple current-mode DAC systems and a first power combiner. The gate length of transistors within each DAC module may be between 6 and 40 nm. Each current-mode DAC system includes a transmission line (e.g., 40 to 80 microns long) coupled to multiple interleaving sub-DAC systems (within the current-mode DAC systems) and the first power combiner. The first power combiner combines, without interleaving, analog signals that have been interleaved within the current-mode DAC systems. The impedance of the first power combiner matches the impedance of each of the current-mode DAC systems and a load of the first power combiner. A second power combiner combines, without interleaving, analog signals from the DAC modules.

20 Claims, 16 Drawing Sheets

(51) Int. Cl.
  *H03M 1/74* (2006.01)
  *H03M 1/00* (2006.01)
(58) Field of Classification Search
  USPC .................. 341/144, 145, 150, 136; 345/208
  See application file for complete search history.

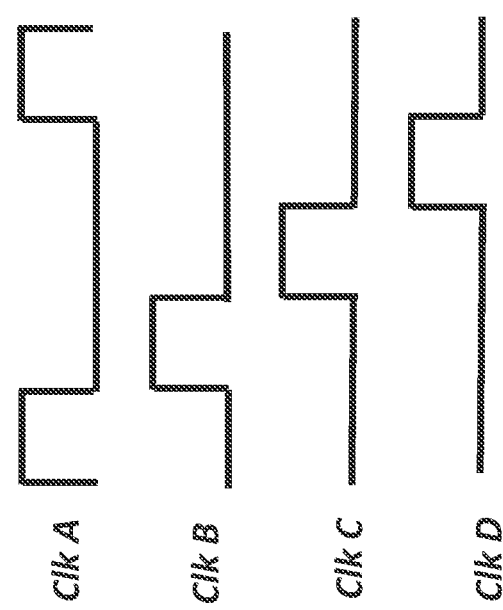

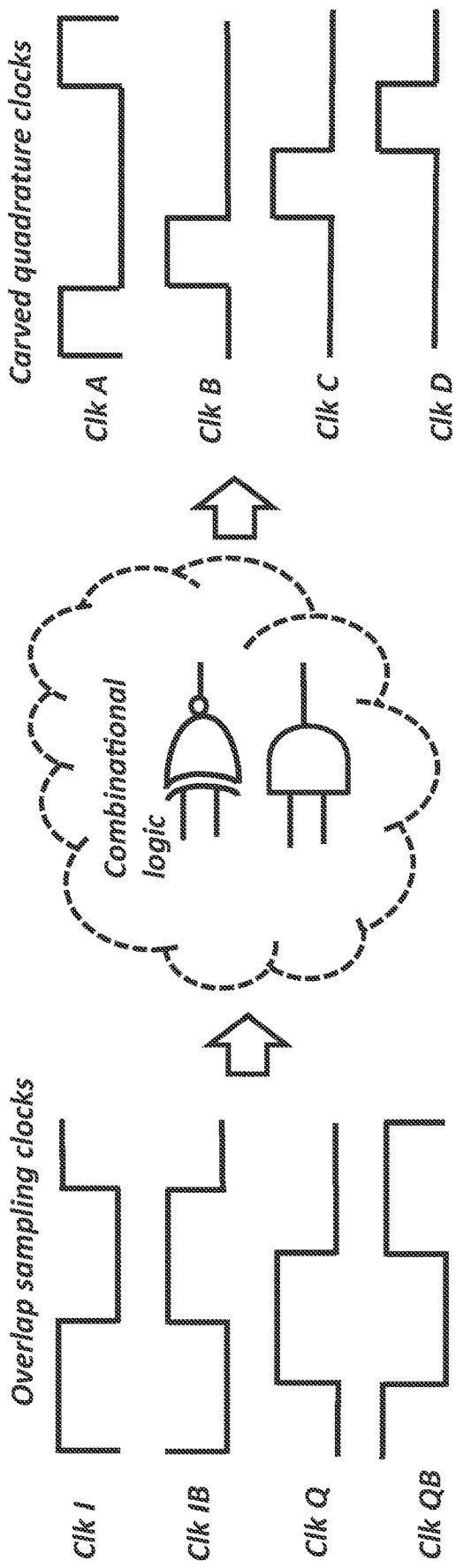
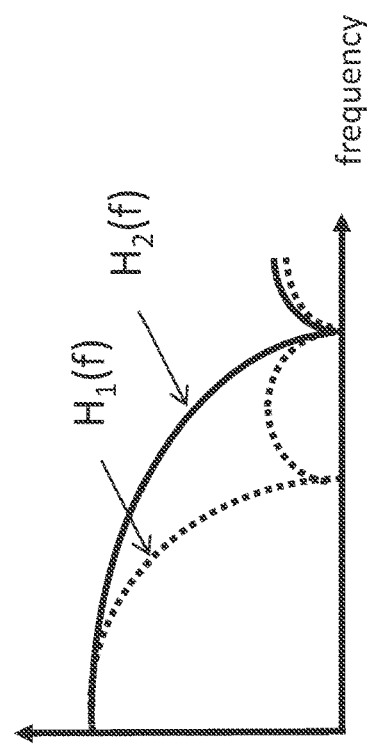
FIG. 8A
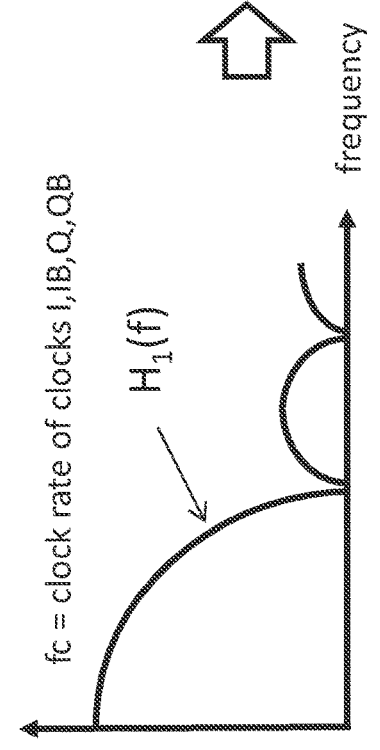
FIG. 8B

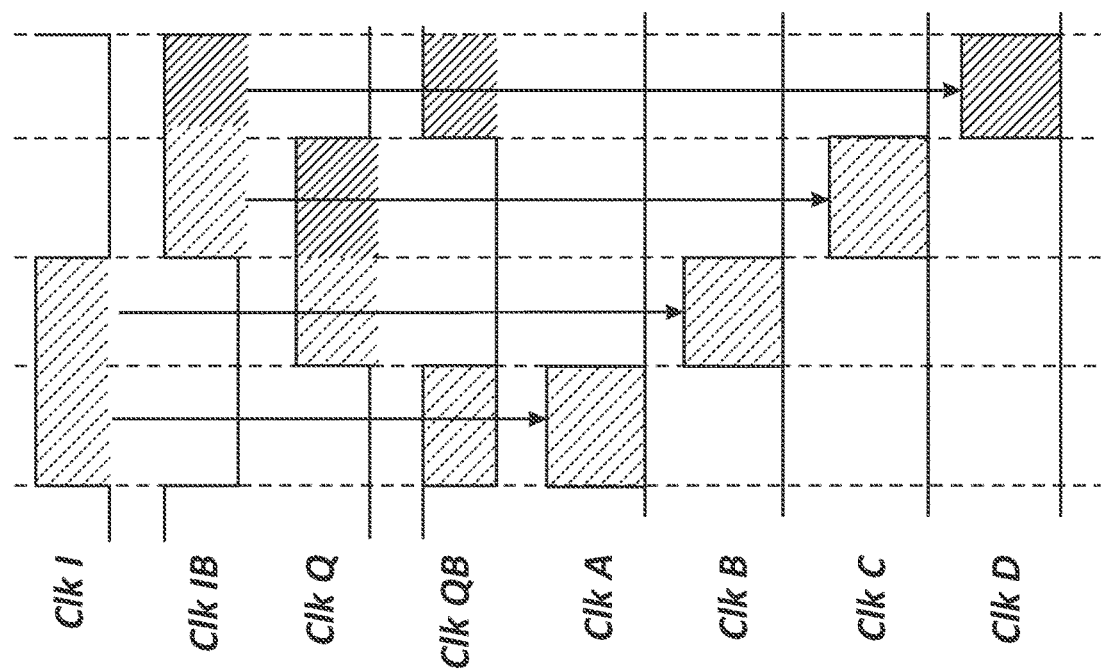
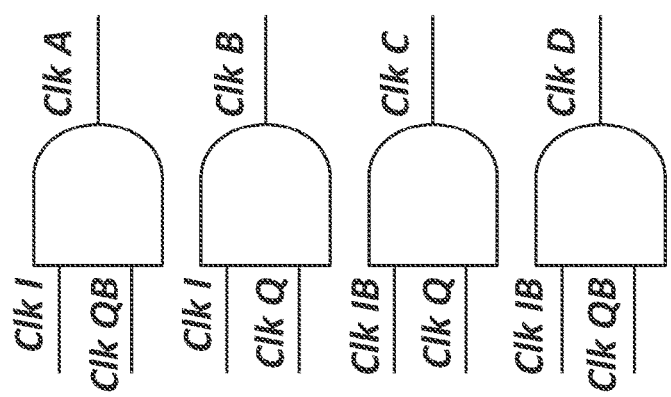
FIG. 9

ULTRA-HIGH SPEED DIGITAL-TO-ANALOG (DAC) CONVERSION METHODS AND APPARATUS HAVING SUB-DAC SYSTEMS FOR DATA INTERLEAVING AND POWER COMBINER WITH NO INTERLEAVING

CROSS-REFERENCE TO RELATED APPLICATION

This is a national stage of Application No. PCT/US2018/040881, filed on Jul. 5, 2018, which claims the benefit of U.S. Provisional Patent Application No. 62/528,921, filed on Jul. 5, 2017, the entirety of each of which is incorporated herein by reference for all purposes.

TECHNICAL FIELD

The present description relates in general to digital-to-analog conversion systems, and more particularly to, for example, without limitation, ultra-high speed digital-to-analog conversion systems having sub-digital-to-analog conversion systems for data interleaving and power combiner with no interleaving.

BACKGROUND

Digital-to-analog conversion devices or systems are commonly used to convert digital signals to analog signals. The digital signals are received at a certain frequency and converted to analog signals at a different frequency, which is generally higher than the frequency of the received digital signals. In digital-to-analog conversion devices or systems that are designed to convert the digital signals to analog signals at high speeds or high frequency, the various signal converting components or blocks are spaced apart from each other in order to not breach thermal constraints of the digital-to-analog conversion devices or systems. As the speed or frequency of the digital-to-analog conversion devices or systems are increased, the heat generated by the various components or blocks of the digital-to-analog conversion devices or systems also increases, and these components may be further spaced apart to satisfy thermal constraints of the digital-to-analog conversion devices or systems. The distance between the various components affects signal integrity when such signals have to travel the distances between the components. Such signal integrity issues and existing systems or techniques for combining signals limit the speed of the digital-to-analog conversion devices.

BRIEF DESCRIPTION OF THE DRAWINGS

FIG. 7 illustrates an example of clock signals of 25% duty cycle.

FIG. 8A illustrates an example of conversion of overlap sampling clock signals to carved quadrature clock signals.

FIG. 8B illustrates examples of frequency responses associated with the overlap sampling clock signals and the carved quadrature clock signals of FIG. 8A.

FIG. 9 illustrates an example of a combinatorial logic circuit for converting the overlap sampling clock signals of FIG. 8A to the carved quadrature clock signals of FIG. 8A.

Figure 1:
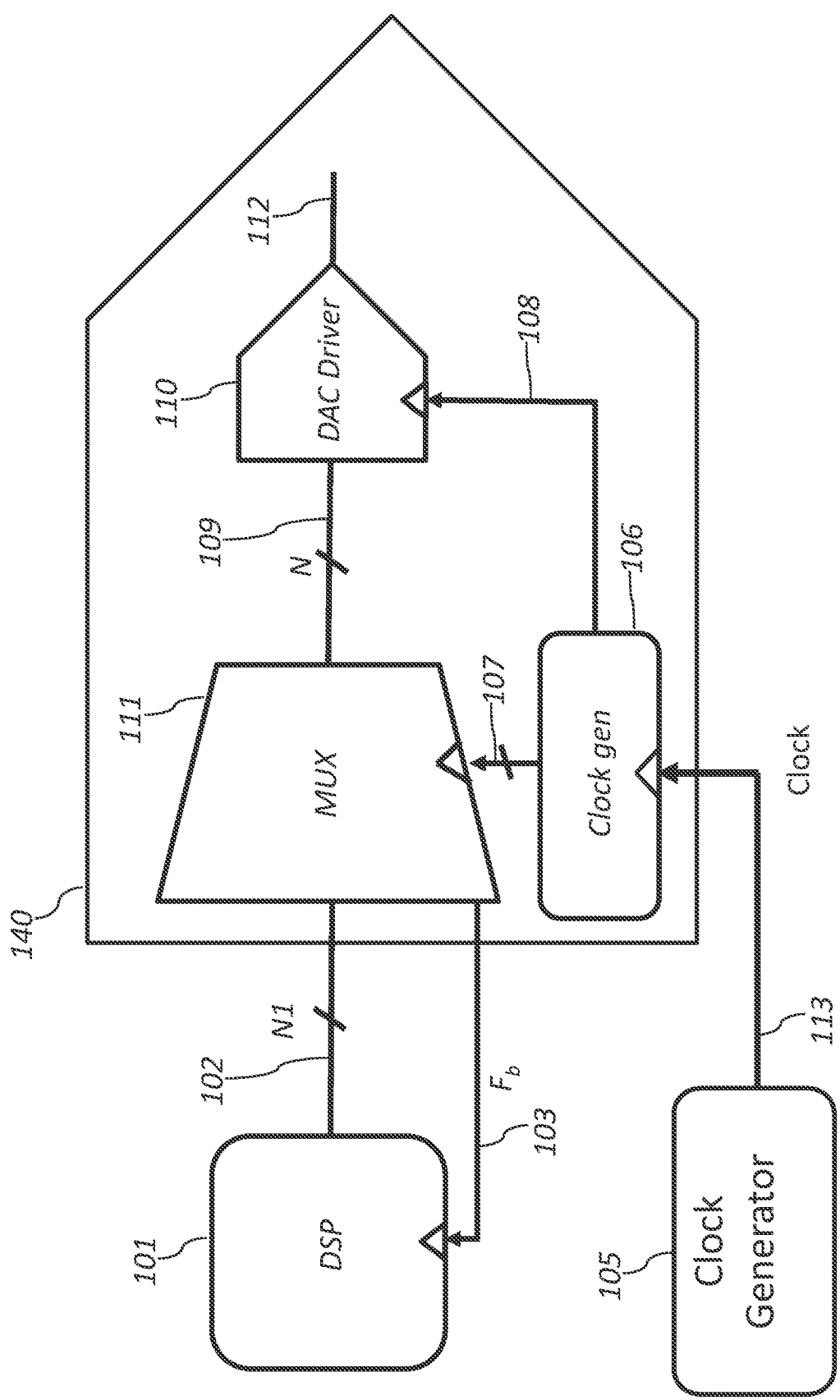
FIG. 1 is a block diagram illustrating an example of a conversion device that includes a digital-to-analog conversion (DAC) system.

In one or more implementations, not all of the depicted components in each figure may be required, and one or more implementations may include additional components not shown in a figure. Variations in the arrangement and type of the components may be made without departing from the scope of the subject disclosure. Additional components, different components, or fewer components may be utilized within the scope of the subject disclosure.

DETAILED DESCRIPTION

The detailed description set forth below is intended as a description of various implementations and is not intended to represent the only implementations in which the subject technology may be practiced. As those skilled in the art would realize, the described implementations may be modified in various different ways, all without departing from the scope of the present disclosure. Accordingly, the drawings and description are to be regarded as illustrative in nature and not restrictive.

Generally, to produce a digital-to-analog conversion (DAC) device that can effectively operate at speeds or frequencies greater than the maximum feasible speed or frequency limit of a single DAC system, multiple DAC systems may be combined. However, combining multiple DAC systems leads to several design and/or manufacturing challenges. An example of such a challenge is the coupling of high frequency signals, i.e. clock signals and/or output tones or signals, among the devices, which may result in distortion and/or spurs for a particular device due to the intermixing of parasitic signals with the actual clock signal and/or output signal of that device. The positioning of the components apart from each other results in increased lengths of the signal transmission lines between components. For example, an increase in the spacing between two DAC systems on a die may result in an increase in the length of transmission lines between the DAC systems and another component of the DAC system, such as a combiner network. The increase in the length of the transmission lines between the DAC systems and another component, such as the combiner network may result in the increase in time delay for output signals of the DAC systems to travel from the DAC systems to the other component. The increase in length of transmission lines and/or in time delays may result in interference with signal or affects signal integrity before the signal reaches its destination component. For example, a signal transmitted on such a transmission line may be reflected back.

The systems and/or techniques described herein allow for combination of current signals in a smaller area with fewer DAC systems, generating voltage signals, based on the current signals, and transmission of the voltage signals to a combiner network for a combined signal output. The impedance of these DAC systems at an input point to the combiner network matches the impedance of the combiner circuit at the input point. The impedance of a load network coupled to an output node at the combiner matches the impedance of the combiner circuit at the output node. Such matching of the impedance suppresses a signal from bouncing back and forth on a transmission line between two components. Thus, the integrity of output signals from the DAC systems to another component, such as a combiner circuit is not affected, which allows for combination of the analog voltage signals using combiner circuits, which allows ultra-high speed digital-to-analog conversion (e.g., greater than or equal to 20 GHz).

In one or more implementations, the subject technology provides a conversion device that includes one or more digital-to-analog conversion (DAC) systems and one or more combiner circuits. In some aspects, the conversion device includes one or more pre-coding circuits (e.g., digital pre-coding circuits). In some aspects, the conversion device may include two or more DAC systems in a parallelized architecture. In an aspect, each DAC system may be referred to as a DAC slice of the conversion device.

In an aspect, parallelization of the DAC systems may facilitate achieving of high sampling frequency operation. The parallelization may occur in the digital and/or analog domains. In the digital domain, a digital representation of an overall DAC data may be generated through a pre-coding operation. The pre-coding operation may be performed by one or more pre-coder circuits. The digital data may be carved up (e.g., divided) into portions by individual pre-coder circuits. These portions may be provided to the multiple individual DAC systems. For instance, each individual DAC system may receive a portion(s) of the digital data. At the individual DAC systems, the portion(s) of the digital data may undergo multiplexing operations to convert the frequency of the digital data to higher frequency rates (e.g., upconvert). The individual DAC systems may generate, via a driver, analog signals from the high speed/rate digital data, resulting from the multiplexing operations, and provide or transmit the analog signals to one or more combiner circuits. The analog signals from the individual DAC systems may be combined in the analog domain via one or more combiner circuits. The combiner circuit(s) may allow the analog signals to be summed coherently to form a desired waveform (e.g., a desired high frequency waveform). In an aspect, the utilization of multiple combiner circuits may facilitate summing of the analog outputs of the DAC systems at higher speeds to form a waveform at higher frequencies.

FIG. 1 is a block diagram illustrating an example of a conversion device 100 that includes a DAC system 140, a DSP circuit 101, a clock generation circuit 105. In an aspect, the DAC system 140 may be referred to as a DAC. The DAC system 140 includes a multiplexer (MUX) circuit 111, a clock generation circuit 106, and a DAC driver circuit 110. The DSP circuit 101 may be coupled to the DAC system 140 via one or more data lines 102. The DSP circuit 101 may be configured to provide signals to the DAC system 140 to operate the DAC system 140. In one or more implementations, the DSP circuit 101 may include a digital pre-coder circuit, such as digital pre-coder circuit 201 shown in FIG. 2. In some implementations, the DSP circuit 101 may be coupled to a digital pre-coder circuit. In some implementations, the DSP circuit 101 may be referred to as a digital pre-coder circuit.

As described above, the DAC system 140 includes the MUX circuit 111. The MUX circuit 111 is configured to receive digital baseband signals from the DSP circuit 101 via the data lines 102. The MUX circuit 111 may be an up-sampler MUX circuit. The digital baseband signals may be received by the MUX circuit 111 at a first rate or frequency, for example at a baud rate ($F_b$), and the MUX circuit 111 may be configured to convert the received digital baseband signals at the first rate to a digital signal at second rate or frequency, which is a higher rate or frequency than the first rate or frequency, such as a sampling rate ($F_s$). The first rate or frequency may be between 1 MHz to 600 MHz. For example, the first rate or frequency may be a baud rate at 500 MHz. In some implementations, the second rate or frequency may be between 1 GHz to 90 GHz. For example, the second rate or frequency may be at a sampling rate or a fraction of a sampling rate of a clock signal generated by the clock generation circuit 106 or 105, such as 64 or 32 GHz. The MUX circuit 111 may be configured to provide or transmit the converted digital signal to the DAC driver circuit 110 via the data lines 109.

In some implementations, the MUX circuit 111 may be configured to be a multi-stage MUX, where the MUX circuit 111 converts a received digital signal to an output digital signal via multiple stages. At the first stage, the MUX circuit 111 may be configured to convert a received input digital signal at a first frequency (e.g., at a baud rate) to a digital signal at a second frequency (different from the second frequency described above), which is twice that of the first frequency (e.g., twice the baud rate). At the second stage, the MUX circuit 111 may be configured to convert the digital signal at the second frequency to a digital signal at a third rate or frequency, which is twice that of the second rate or frequency. At the third stage, the MUX circuit 111 may be configured to convert the digital signal at the third frequency to a digital signal at a fourth frequency, which is twice that of the second frequency. At the fourth stage, the MUX circuit 111 may be configured to convert the digital signal at the fourth frequency to a digital signal at a fifth frequency, which is twice that of the fourth frequency, and so forth. The number of stages of the MUX circuit 111 may depend on the number of stages needed to convert the digital signal at the first frequency to a digital signal at the sampling frequency. For example, if the first frequency is at the baud rate, then the final frequency may equal to the sampling frequency or rate.

In some implementations, depending on the architecture of the DAC system 140, the number of data lines, N1, in the data lines 102 may be a function of the sampling rate ($F_s$), the baud rate ($F_b$), and/or the number of bits of the digital signal received from the DSP circuit 101. The number of data lines N1 in the data lines 102 may be greater than the number of data lines, N, in the data lines 109. In some implementations, depending on the architecture of the DAC system 140, the number of data lines N1 in the data lines 102 may be dependent on the number of bits of the digital signal. Similarly, depending on the architecture of the DAC system 140, the number of data lines N1 in the data lines 102 may be dependent on the number of bits that the MUX circuit 111 is configured to receive. In some implementations, depending on the architecture of the DAC system 140, the number of data lines N1 can be greater than the number of bits in the digital signal transmitted from the DSP circuit 101 to the MUX circuit 111. In some implementations, depending on the architecture of the DAC system 140, the number of data lines N in the data lines 109 may be equal to the number of bits in the converted digital signal provided or transmitted by the MUX circuit 111.

The clock generator circuit 105 may be configured to generate a sampling clock signal 113 at a sampling rate $F_s$, such as $F_s$ of 64 GHz, and to provide the clock signal to the clock generator circuit 106. The clock generator circuit 106 may be configured to divide a received clock signal, such as the clock signal 113, into a number of clock signals, each at a fraction of the rate of the received clock signal, such as clock signals 107. For example, if the received clock signal is at a sampling rate of 32 GHz, then the clock generator circuit 106 may generate a number of clock signals 107 by dividing the received clock signal into a number of clock signals at rates that are fractions of 32 GHz, such as one clock signal at 16 GHz, another clock signal at 8 GHz, another clock signal at 4 GHz, another clock signal at 2 GHz, another clock signal at 1 GHz, and the like. As described above, in some implementations, the MUX circuit 111 may be a multi-stage MUX, and in such implementations, each of the clock signals 107 may be utilized for different stages of the MUX. For example, the 1 GHz clock signal may be used at a first stage of the MUX, with the 2 GHz clock signal used at a second stage, the 4 GHz clock signal used at a third stage, the 8 GHz clock signal used at a fourth stage, the 16 GHz clock signal used at a fifth stage, and so forth. The clock generator circuit 106 may be configured to provide the divided clock signals 107 to the MUX circuit 111. The MUX circuit 111 operates based on the clock signals 107.

The clock generator circuit 106 may be configured to provide a clock signal to the DAC driver circuit 110, such as the clock signal 108. In some implementations, the clock generator circuit 106 may be configured to provide the clock signal 108 at the sampling rate of the received clock signal 113 to the DAC driver circuit 110. In some implementations, the clock generator circuit 106 may be configured to provide the clock signal 108 at a fraction of the rate of the sampling rate of the received clock signal 113. The DSP circuit 101 receives a trigger clock signal 103 at a certain frequency or rate, such as the baud rate $F_b$, from the MUX circuit 111. The DSP circuit 101 may be configured to provide the digital baseband signal to the MUX circuit 111 at a rate or frequency equal to the rate or frequency of the trigger clock signal 103.

As described above, the DAC system 140 comprises the DAC driver circuit 110. In some implementations, the DAC driver circuit 110 may be a resistive driver circuit. In some implementations, the DAC driver circuit 110 may be a current steering driver circuit. The DAC driver circuit 110 may be configured to generate an analog signal based on the digital signal received from the MUX circuit 111. The analog signal may be a representation of the values of the bits of the digital signal received from the MUX circuit 11. The sampling rate of the DAC driver circuit 110 may be set based on or by the sampling clock signal 108. The analog signal provided by the DAC driver circuit 110 may be output via data lines or transmission lines 112 from the DAC driver circuit 110 to another component or a network, such as a combiner circuit, such as combiner circuit 206 (shown in FIG. 2).

While FIG. 1 illustrates an example of a conversion device that includes a single DAC system, the methods, systems, and techniques described herein provide for conversion devices that comprise more than a single DAC system. Additional details of conversion devices that include more than a single DAC system are described herein with reference to other figures, for example, FIGS. 2, 4A-4C, 5A-5D, and 14.

Figure 2:
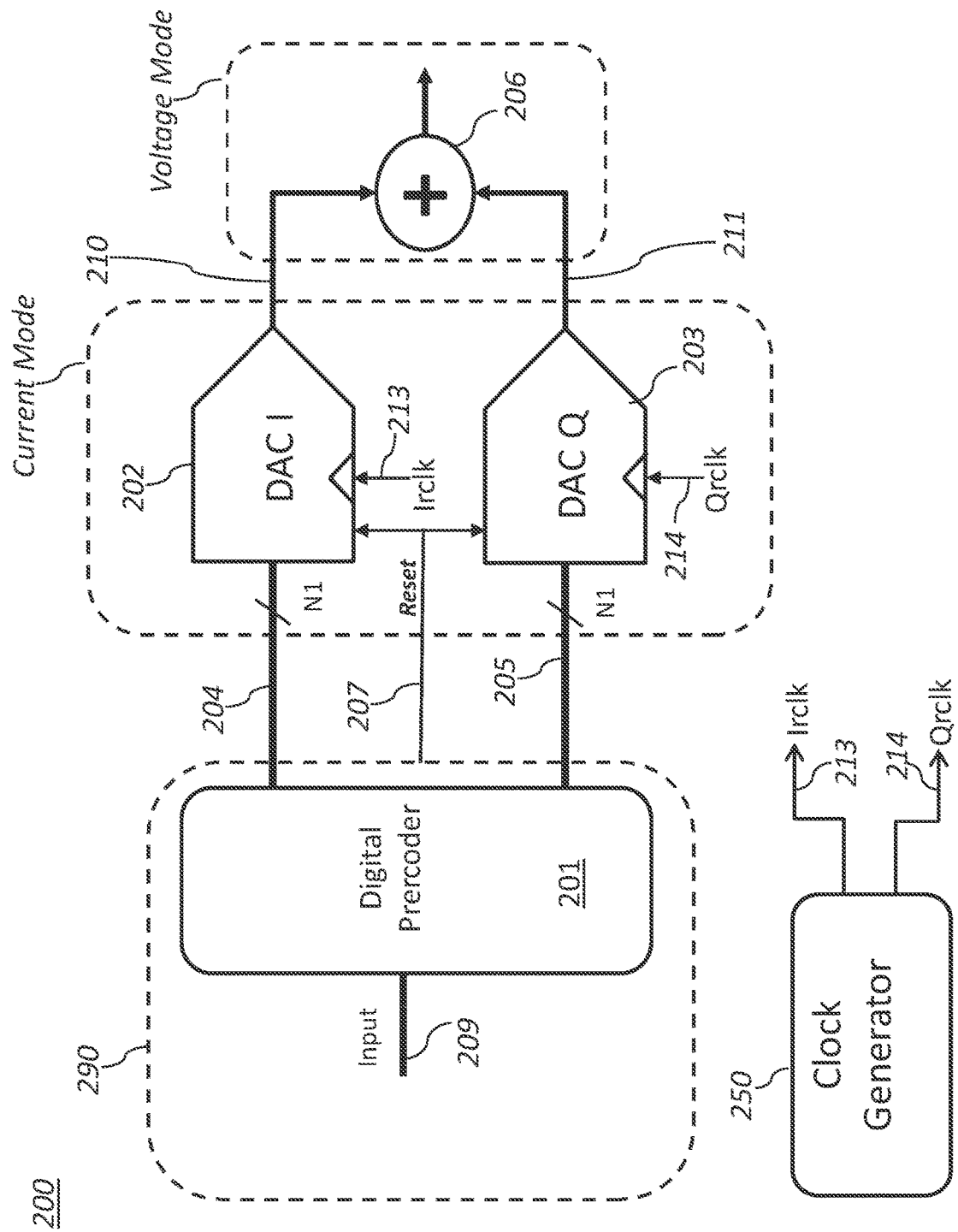
FIG. 2 illustrates an example of a conversion device that includes multiple DAC systems.

FIG. 2 illustrates an example of a conversion device 200 that includes more than a single DAC system, DAC systems 202, 203. The conversion device 200 includes the DSP circuit 209, a combiner circuit 206, a clock generator circuit 250. The DAC systems 202 and 203 may be similarly configured as the DAC system 140 described in FIG. 1. For example, each of the DAC systems 202 and 203, includes MUX circuits (not shown), DAC driver circuits (not shown), and clock generator circuits (not shown). The MUX circuits of the DAC systems 202 and 203 may be similarly configured as the MUX circuit 111. The DAC driver circuits of the DAC systems 202 and 203 may be similarly configured as the DAC driver circuit 110. In some implementations, the conversion device 200 utilizes an interleaved-hold strategy. In some implementations, the DAC systems 202 and 203 may be operating in quadrature. In such implementations, a DAC system, such as DAC system 202, may be, or may be referred to as, the in-phase DAC system (DAC I) and the other DAC system, such as the DAC system 203, may be, or may be referred to as, the quadrature DAC system (DAC Q). The DAC system 202 (DAC I) and the DAC system 203 (DAC Q) may be operated using clock signals generated by clock generator circuits (not shown) of the DAC systems 202, 203. The DAC systems 202, 203 can be reset via a common reset signal, such as reset signal 207.

The clock signals generated by the clock generator circuits of the DAC systems 202, 203 may be based on a clock signal received by the DAC systems 202 and 203. For example, as shown in FIG. 2, the DAC system 202 receives clock signal 213 (I-clk) and the DAC system 203 receives clock signal 214 (Q-clk). The clock signals 213 and 214 may be received from a clock generator circuit, such as the clock generator circuit 250. The clock generator circuit 250 may be configured to generate clock signals 213 and 214 at a certain sampling rate. In some implementations, the clock signal 213 and the clock signal 214 may be 90° out of phase and may be referred to as quadrature clock signals. Additional details of clock signals generated and provided to the DAC systems 202 and 203 are described with reference to FIG. 3.

The clock generator circuits of the DAC systems 202 and 203 may be configured to generate clock signals at the sampling rate of the clock signals 213 and 214 and/or a fraction of the sampling rate of the clock signals 213 and 214, and provide the generated clocks signals to the MUX circuits and the DAC driver circuits of the DAC systems 202 and 203. For example, the clock generator circuits of the DAC systems 202 and 203 may be configured to generate a clock signal at half the sampling rate of the clock signals 213 and 214 and provide the generated clock signals to the DAC driver circuits of the DAC systems 202 and 203. Similarly, the clock generator circuits of the DAC systems 202 and 203 may be configured to generate clock signals at half the sample rate of the received clock signals 213 and 214, and further generate a number of clock signals at different fractions of the rate of the clock signal generated at half the sample rate of the clock signal, and provide the number of clock signals to the MUX circuits of the DAC systems 202 and 203. Additional details of clock signals generated for DAC systems, such as DAC systems 202, 203 are described with reference to FIG. 3. The DAC systems 202 and 203 may be operating in current-mode.

The DSP circuit 290 includes a digital pre-coder circuit 201. The digital pre-coder circuit 201 may receive a input digital signal 209 and be configured to generate in-phase digital signals 204 of N1 bits and quadrature digital signals 205 of N1 bits, based on the input digital signal 209. The digital pre-coder circuit 209 may be configured to provide or transmit the in-phase digital signals to the in-phase DAC system, DAC system 202, and provide or transmit the quadrature digital signal to the quadrature DAC system, DAC system 203.

The combiner circuit 206 is coupled to the DAC systems 202 and 203 via transmission lines 210 and 211. In an aspect, the combiner circuit may be referred to as a combiner network or a combiner network circuit. The DAC systems 202 and 203 may generate analog signals and provide these analog signals to the combiner circuit via transmission lines 210 and 211, respectively. In some implementations, the analog signals may be analog voltage signals. In some implementations, the analog signals may be analog current signals. In some implementations, the analog signals may be analog power signals. The combiner circuit 206 may be configured to combine the analog signals received from the DAC systems 202 and 203. For example, the combiner circuit 206 may be configured to combine the received analog signals by generating a sum of the analog signals. In some implementations, such combining may be analogous to combining quadrature radio frequency (RF) signals. In an aspect, image rejection capability may be realized. In some implementations, the combiner circuit 206 may be, may include, or may be referred to as, a power combiner circuit.

In some implementations, outputs of the DAC system 202 and the DAC system 203 are synchronized in time, and no retiming (e.g., no time shifts) need to be applied to the outputs prior to combining the outputs by the combiner circuit 206. In such implementations, the outputs of the DAC system 202 and the DAC system 203 may be referred to as being properly conditioned. For example, the outputs of the DAC system 202 and the DAC system 203 are considered to be synchronized in time (or substantially synchronized in time) when a time delay of an output from the DAC system 202 to the combiner circuit 206 matches (or substantially matches) a time delay of the output from the DAC system 203 to the combiner circuit 206. The time delay associated with the DAC system 202 output may be based on a path length (e.g., physical path length) between the DAC system 202 output and the combiner circuit 206. Similarly, the time delay associated with the DAC system 203 output may be based on a path length between the DAC system 203 output and the combiner circuit 206. In some implementations, when the time delays are not matched when the clock signal 213 (I-clk) and the clock signal 214 (Q-clk) are 90° out of phase, the phase difference between the clock signal 213 (I-clk) and the clock signal 214 (Q-clk) may be adjusted to be other than 90° to allow the time delays to be matched. Such phase adjustment may be referred to as pre-distortion and may be performed to compensate for unequal time delay. Additional details of generating pre-distorted clock signals are described with reference to FIG. 3.

In some implementations, no time interleaving of the DAC I and DAC Q systems, such as the DAC systems 202, 203, respectively, is needed at the physical summing point. In such implementations, the DAC I system (e.g., DAC system 202), and DAC Q system (e.g., DAC system 203) may be physically connected at the summing point via the combiner circuit.

Figure 3:
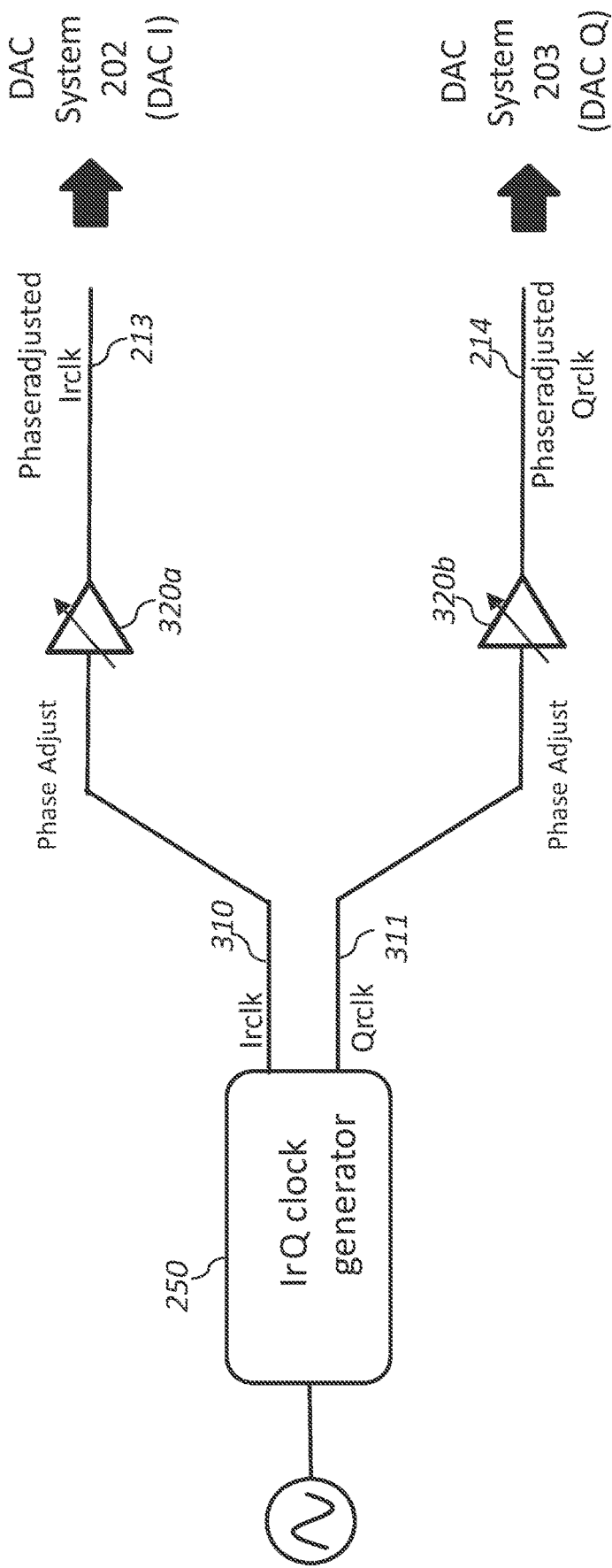
FIG. 3 illustrates an example of a pre-distortion scheme for generating pre-distorted in-phase and quadrature (I and Q) clock signals.

FIG. 3 illustrates an example of a pre-distortion scheme for generating pre-distorted I and Q clock signals. As described above, the clock generator circuit 250 may be configured to generate the I-clk and Q-clk clock signals, such as the clock signal 310 and the clock signal 311. In some implementations, the clock generator circuit 250 may be referred to as an I-Q clock generator circuit. In some implementations, the clock generator circuit 250 may be implemented using an RC-CR (resistor-capacitor-capacitor-resistor) network, a microwave I-Q phase shifter, and/or an active delay locked loop. The pre-distortion of I clock signal 310 and/or Q clock signal 311 may be referred to as quadrature phase adjustment. The pre-distorted I-Q clock scheme of FIG. 3 may apply phase adjustment to one or both of the clock signals 310 and 311. The phase adjusted I-clk clock signal 213 and/or phase adjusted Q-clk clock signal 214 may be provided to DAC systems, such as the DAC system 202 and the DAC system 203 (e.g., a clock generator circuit of the DAC system). For instance, with reference to FIG. 2, the phase adjusted I-clk clock signal 213 and Q-clk clock signal 214 may be represented by the I-clk clock signal 213 and the Q-clk clock signal 214 provided to the DAC system 202 (DAC I) and the DAC system 203 (DAC Q system), respectively.

In some implementations, alternatively or in addition to pre-distorting the clock signal(s), pre-distortion may be applied to the data (e.g., I and/or Q data). In some implementations, a phase adjustment circuit, such as phase adjustment circuits 320a, 320b, as shown in FIG. 3, may perform the phase adjustment. The phase adjustment circuits 320a, 320b, may be included, or is a part of, a clock buffer, a phase shifter, combination thereof, among others. In some implementations, the phase adjustment circuits 320a, 320b, may be included within the clock generator circuit 250. In some implementations, the phase that is applied by the phase adjustment circuit may be tunable. For instance, phase adjustment(s) applied to the I-clk clock signal 310 and/or Q-clk clock signal 311 may be tuned based on the time delay associated with the DAC system 202 (DAC I) output and DAC system 203 (DAC Q) output.

In some implementations, the phase adjustments applied to the I-clk clock signal 310 and the Q-clk clock signal 311 may be same. In some implementations, the phase adjustments applied to the I-clk clock signal 310 and Q-clk clock signal 311 are different. In some implementations, different phase adjustment circuits may be applied to the different clock signals generated by the clock generator circuit 250. For example, as shown in FIG. 3, the I-clk clock signal 310 may be phase adjusted via the phase adjustment circuit 320a, and the Q-clk clock signal 311 may be phase adjusted via the phase adjustment circuit 320b. In some implementations, no phase adjustments may be applied to the I-clk clock signal 310 and the Q-clk clock signal 311. Although the pre-distortion shown in FIG. 3 is described with reference to the conversion device of FIG. 2, the pre-distortion of one or more clock signals may, but need not be applied to other conversion devices, such as the conversion devices illustrated in FIGS. 4A, 5A, and 14.

Figures 4A, 4B, 4C:
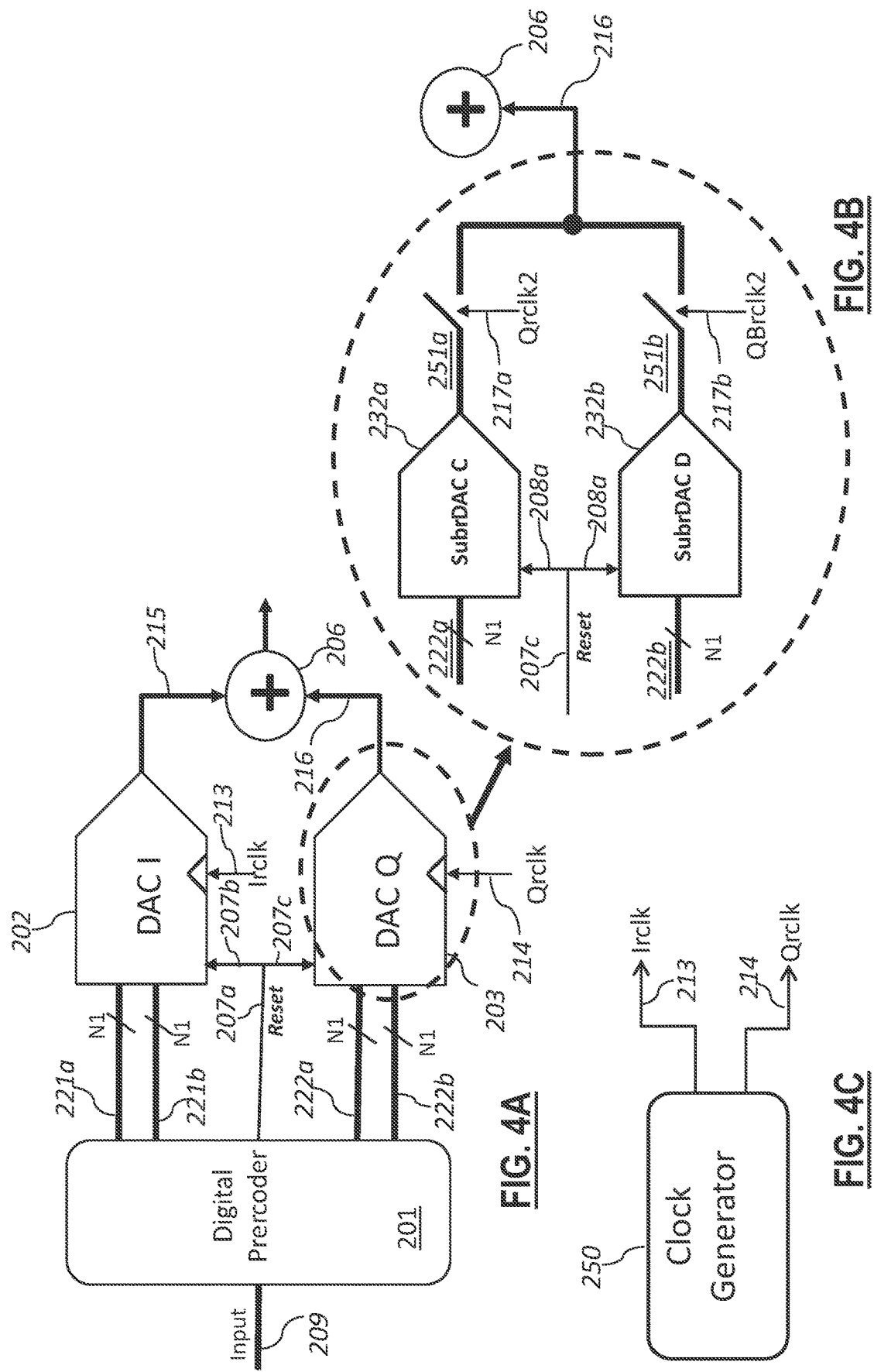
FIG. 4A-4C illustrates an example of a conversion device that includes multiple DAC systems.
Figure 5A:
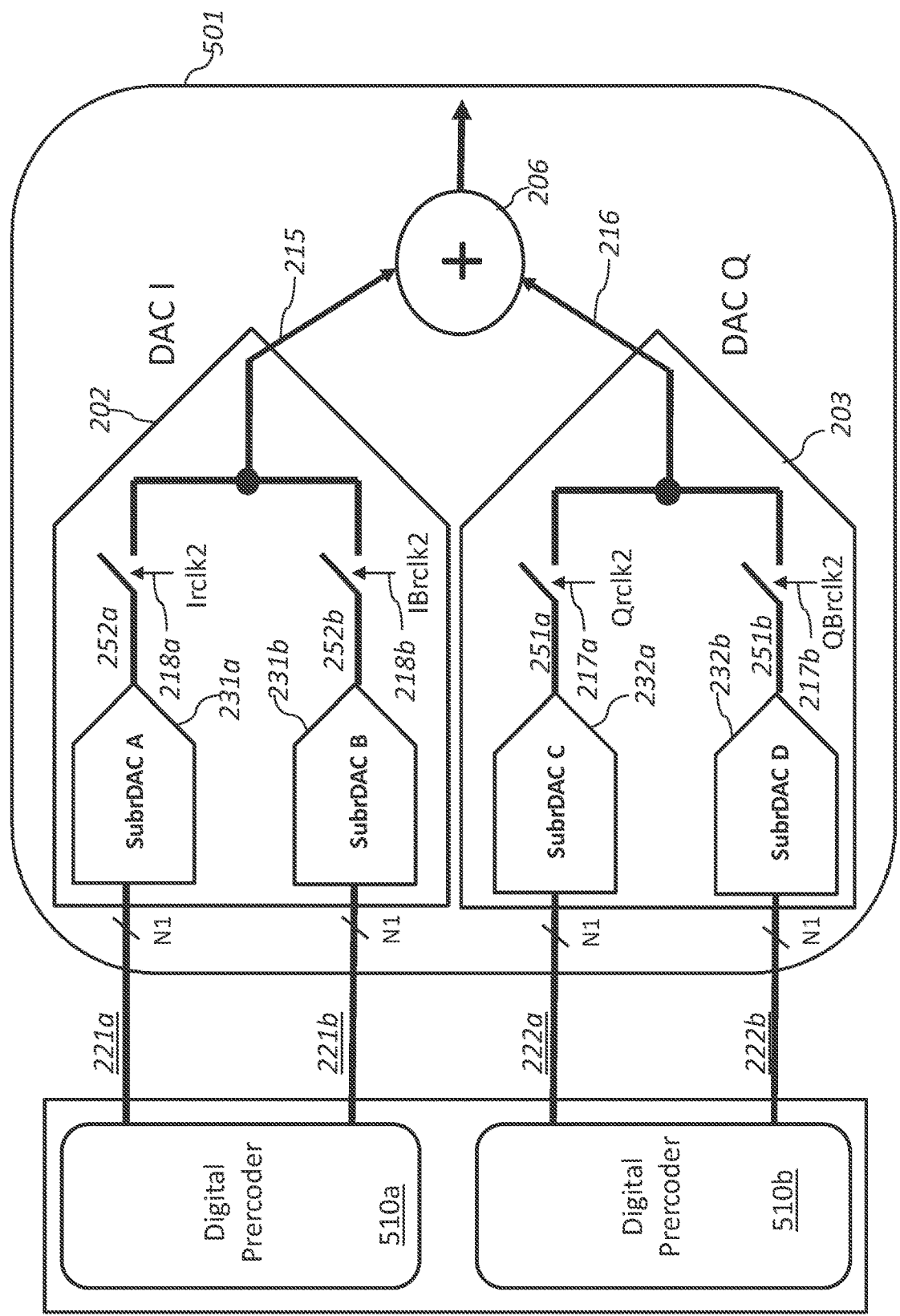
FIG. 5A-5D illustrates an example of a conversion device that includes multiple DAC systems, where each DAC system is formed of sub-DAC systems.

FIG. 4A illustrates an example of a conversion device 400 that includes more than a single DAC system. The description from FIG. 2 generally applies to FIG. 4A, with examples of differences between FIG. 2 and FIG. 4A and other description provided herein for purposes of clarity and simplicity. The DAC system 202 may comprise two sub-DAC systems, such as sub-DAC systems 231a, 231b, as shown in FIG. 5A. The DAC system 203 may comprise two sub-DAC systems, such as sub-DAC systems 232a, 232b as shown in FIG. 4B and FIG. 5A. The DAC systems 202 may receive two sets of digital signals 221a, 221b, each of N1 bits. The DAC system 203 may receive two sets of digital signals 222a, 222b, each of N1 bits. In some implementations, the number of DAC systems, the number of sub-DAC systems and/or the number of DAC unit cells in a driver circuit may be based on the number of sets of digital signals received by the DAC system. As described above, the digital pre-coder circuit 201 may receive an input signal, such as the input signal 209, and generate a respective set of N signals for each of the DAC systems, such as the DAC system 202, 203, based on the input signal 209. Each sub-DAC system of a DAC system may receive a set of input signals received by the DAC system. For example, as shown in FIG. 4A, DAC system 203 comprises sub-DAC system 232a and sub-DAC system 232b, and the sub-DAC system 232a receives the set of digital signals 222a and the sub-DAC system 232b receives the set of digital signals 222b.

Each of the sub-DAC systems 231a, 231b, 232a, 232b comprises a MUX circuit, a DAC driver circuit, and a clock generator circuit. The MUX circuits and DAC circuits of the sub-DAC systems 231a, 231b, 232a, 232b may be similarly configured and designed as the MUX circuit 111 and the DAC circuit 110 of the DAC system 140 described above in FIG. 1.

The clock generator circuits of the DAC systems 202 and 203 may be configured to generate clock signals at a fraction of the sampling rate of the clock signals 213 and 214, and provide the generated clocks signals to the MUX circuits and the DAC driver circuits of the DAC systems 202 and 203. For example, the clock generator circuits of the DAC systems 202 and 203 may be configured to generate a clock signal at half the sampling rate of the clock signals 213 and 214 and provide the generated clock signals to the DAC driver circuits of the DAC systems 202 and 203. Similarly, the clock generator circuits of the DAC systems 202 and 203 may be configured to generate clock signals at half the sample rate of the received clock signals 213 and 214, and further generate a number of clock signals at different fractions of the rate of the clock signal generated at half the sample rate of the clock signal, and provide the number of clock signals to the MUX circuits of the DAC systems 202 and 203.

The digital pre-coder circuit 201 may generate and/or provide the set of input signals 221a, 221b, 222a, 222b, based on the input digital signal 209. In some implementations, the digital pre-coder circuit 201 may generate the sets of input signals 221a, 221b, 222a, 222, by dividing up the input digital signal 209 by selecting a first bit of the input digital signal 209 for the set of input signal 221a, a second bit of the input digital signal 209 for the set of input signal 221b, a third bit of the input digital signal 209 for the set of input signal 222a, a fourth bit of the input digital signal 209 for the set of input signal 222b. In such implementations, the input signals 221a, 221b, 222a, 222b are interleaved data signals provided to the sub-DAC systems 231a, 231b, 232a, 232b, respectively.

In some implementations, the digital pre-coder circuit 201 may take the sets of signals for the DAC system 203, and alternate between providing one signal to the sub-DAC system 232a and one signal to the sub-DAC system 232b. For example, the sets of signals (e.g., bits) may include, in sequential order, a first signal, a second signal, a third signal, a fourth signal, . . . , an $N^{th}$ signal. The first signal, third signal, etc. may be provided to the sub-DAC system 232a. The second signal, fourth signal, etc. may be provided to the sub-DAC system 232b. In some implementations, other manners may be utilized to provide N1 bits of input signals to each of the sub-DAC systems of the DAC systems 202, 203 or otherwise divide sets of N signals among the two sub-DAC systems. In an aspect, data associated with the time interleaving and distributed between the sub-DAC system 232a and sub-DAC system 232b may be referred as interleaved-data or time interleaved data.

The sub-DAC systems 231a, 231b, 232a and 232b may be configured to transmit or provide output signals to the combiner circuit 206, based on the state of the switches, such as switches 251a, 251b, comprised in the DAC driver circuits of the sub-DAC systems. In FIG. 4A, the switches 251a and 251b are shown outside of the sub-DAC systems 232a and 232b, respectively, for explanatory and illustration purposes. For example, the sub-DAC systems 232a of DAC systems 203 may include switch 251a (shown in FIG. 4B) and the sub-DAC system 232b of DAC systems 203 may include switch 251b (shown in FIG. 4B).

The switches comprised in the DAC driver circuits of the sub-DAC systems 231a, 231b, 232a, 232b, may be configured to operate based on or controlled by the clock signals generated by the clock generator circuits of the respective sub-DAC systems and provided to the DAC driver circuits of the respective sub-DAC systems. For example, as shown in FIG. 4B, the switches 251a, 251b are controlled by the clock signals 217a, 217b, respectively, and the clock signals 217a, 217b are generated based on the clock signal 214 received by the DAC system 203. The clock signals for the switches of a DAC system, such as the clock signal 217a (Q-clk2) and 217b (QB-clk2), may be complementary signals (e.g., 180° out of phase). In some implementations, one or more switches of the sub-DAC systems, such as switches 251a, 251b, may be implemented using a diode, a transistor, and the like. In some implementations, one or more switches of the sub-DAC system may be a single-pole-single-throw switch. In some implementations, one or more switches may facilitate time interleaving by the sub-DAC systems of the DAC systems 202, 203. Additional details of the clock generator circuits of the sub-DAC systems of the DAC systems 202, 203 are described herein with reference to FIG. 5A-5D.

FIG. 5A illustrates an example of an expanded view of a conversion device 500. The conversion device 500 may be similar to the conversion device of FIG. 4A, that includes more than a single DAC system, such as DAC systems 202, 203. The description from FIG. 4A generally applies to FIG. 5A, with examples of differences between FIG. 4A and FIG. 5A and other description provided herein for purposes of clarity and simplicity. In some implementations, as shown in FIG. 5A, the conversion device may include one or more digital pre-coder circuits, such as digital pre-coder circuits 510a, 510b. As described above, the conversion device comprises the combiner circuit 206. The DAC systems 202, 203 may be operating in quadrature, such that the DAC system 202 may be, or may be referred to as, the in-phase DAC system (DAC I) and the DAC system 203 may be, or may be referred to as, the quadrature DAC system (DAC Q). In some implementations, as shown in FIG. 5A, the DAC systems 202, 203 may be associated or grouped with each other to form DAC module 501. In some implementations, the DAC systems 202, 203 may be positioned within a certain distance from each other in the conversion device and form DAC module 501. As shown in FIG. 5A, the DAC module 501 includes the DAC systems 202, 203, and combiner circuit 206. As described above, and as shown in FIG. 5A, the DAC system 202 may include two sub-DAC systems, 231a, 231b that are similar to the sub-DAC systems 232a, 232b described above with reference to FIG. 4B but with different clock signals and input signals. For example, each of the sub-DAC systems 231a, 231b may include a MUX circuit, a DAC driver circuit, and a clock generator circuit. In some implementations, such as shown in FIG. 5A, each of the DAC systems in the conversion device, such as each of the DAC systems 202, 203 may be coupled to a respective digital pre-coder circuit, such as a digital pre-coder circuit 510a, 510b, respectively. The digital pre-coder circuits 510a, 510b may be similarly configured and/or designed as the pre-coder circuit 201 described in reference with FIG. 2. In some implementations, a digital pre-coder circuit may be shared by the DAC systems 202, 203.

The sub-DAC systems 231a, 231b, 232a, 232b may be coupled to a combiner circuit 206 via one or more transmission lines, such as transmission lines 215, 216, as shown in FIG. 5A. Similar to the sub-DAC systems 232a, 232b, the sub-DAC system 231a and sub-DAC system 231b may include the switches 252a, 252b. The switches 252a, 252b may be comprised within the DAC driver circuits of the sub-DAC systems 231a, 231b. The switches 252a, 252b may be similarly configured and designed as the switches 251a, 251b, described above with reference to FIG. 4B. The switches 252a, 252b may be configured to operate based on or be controlled by clock signals provided to the DAC driver circuits of the respective sub-DAC systems by the clock generator circuits of the respective sub-DAC systems. For example, as shown in FIG. 5A, the switches 252a, 252b may be controlled by the clock signals 218a, 218b, where clock signal 218a may be the clock signal provided to the DAC driver circuit of the sub-DAC system 231a and the clock signal 218b may be the clock signal provided to the DAC driver circuit of the sub-DAC system 231b. In some implementations, the I-clk2 clock signal 218a and Q-clk2 clock signal 217a are 90° out of phase, and the IB-clk2 clock signal 218b and QB-clk2 clock signal 217b are 90° out of phase. In some implementations, the I-clk2 clock signal 218a and IB-clk2 clock signal 218b are complementary signals (e.g., 180° out of phase), and the Q-clk2 clock signal 217a and QB-clk2 clock signal 217b are complementary signals. In some implementations, the use of four sub-DAC systems may allow an output at four times the rate of a single DAC system. In an aspect, an aggregation of the I-clk2 clock signal 218a, the IB-clk2 clock signal 218b, the Q-clk2 clock signal 217a, and the QB-clk2 clock signal 218b provide four full phases of clock signals.

Figure 6:
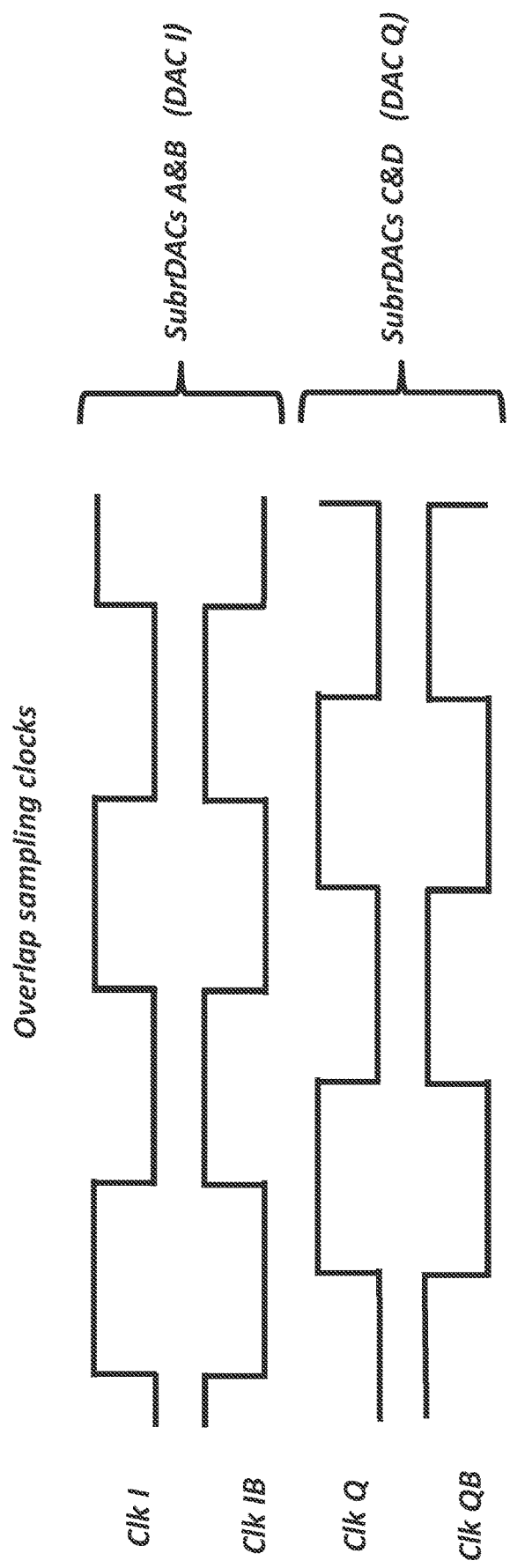
FIG. 6 illustrates an example of clock signals of 50% duty cycle.

In some implementations, the I-clk2 clock signal 218a and Q-clk2 clock signal 217a (or IB-clk2 clock signal 218b and QB-clk2 clock signal 217b) may partially overlap, such that DAC systems 202 and 203 may concurrently provide outputs to the combiner circuit 206. In some implementations, the I-clk2 clock signal 218a and Q-clk2 clock signal 217a (or IB-clk2 clock signal 218b and QB-clk2 clock signal 217b) do not overlap. In some implementations, an output of the DAC system 202 (DAC I system) may be provided to the combiner circuit 206 while the DAC system 203 (DAC Q system) is disconnected from (e.g., shut off from) the combiner circuit 206, or vice versa. In some implementations, the I-clk2 clock signal 218a, Q-clk2 clock signal 217a, IB-clk2 clock signal 218b, and QB-clk2 clock signal 217b may be 50% duty cycle clock signals, an example of which is shown in FIG. 6. In some implementations, the I-clk2 clock signal 218a, Q-clk2 clock signal 217a, IB-clk2 clock signal 218b, and QB-clk2 clock signal 217b may be 25% duty cycle clock signals, an example of which is shown in FIG. 7.

In some implementations, the conversion device may be associated with a fundamental frequency or full sampling rate $F_s$. In some implementations, the fundamental frequency may be referred to as an aggregate sample rate, conversion rate, or master rate/clock. In some implementations, the clock generators of the sub-DAC systems of the DAC systems of the conversion device may be configured to provide clock signals to the DAC driver circuits of the DAC systems at a certain frequency or sampling rate based on the number of sub-DAC systems, such as sub-DAC system 231a, 231b, of the DAC system 202. For example, if each of the DAC systems 202 and 203 comprises two sub-DAC systems, such as sub-DAC system 231a, 231b in DAC system 202, and sub-DAC systems 232a, 232b in DAC system 203, then frequency or sampling rate of each of the I-clk2 clock signal 218a, the IB-clk2 clock signal 218b, the Q-clk2 clock signal 217a, and the QB-clk2 clock signal 217b may be $F_s/2$. Similarly, if each of the DAC systems 202 and 203 comprises four sub-DAC systems, then the frequency or sampling rate of each clock signal associated with a sub-DAC system may be $F_s/4$.

Figure 5B:
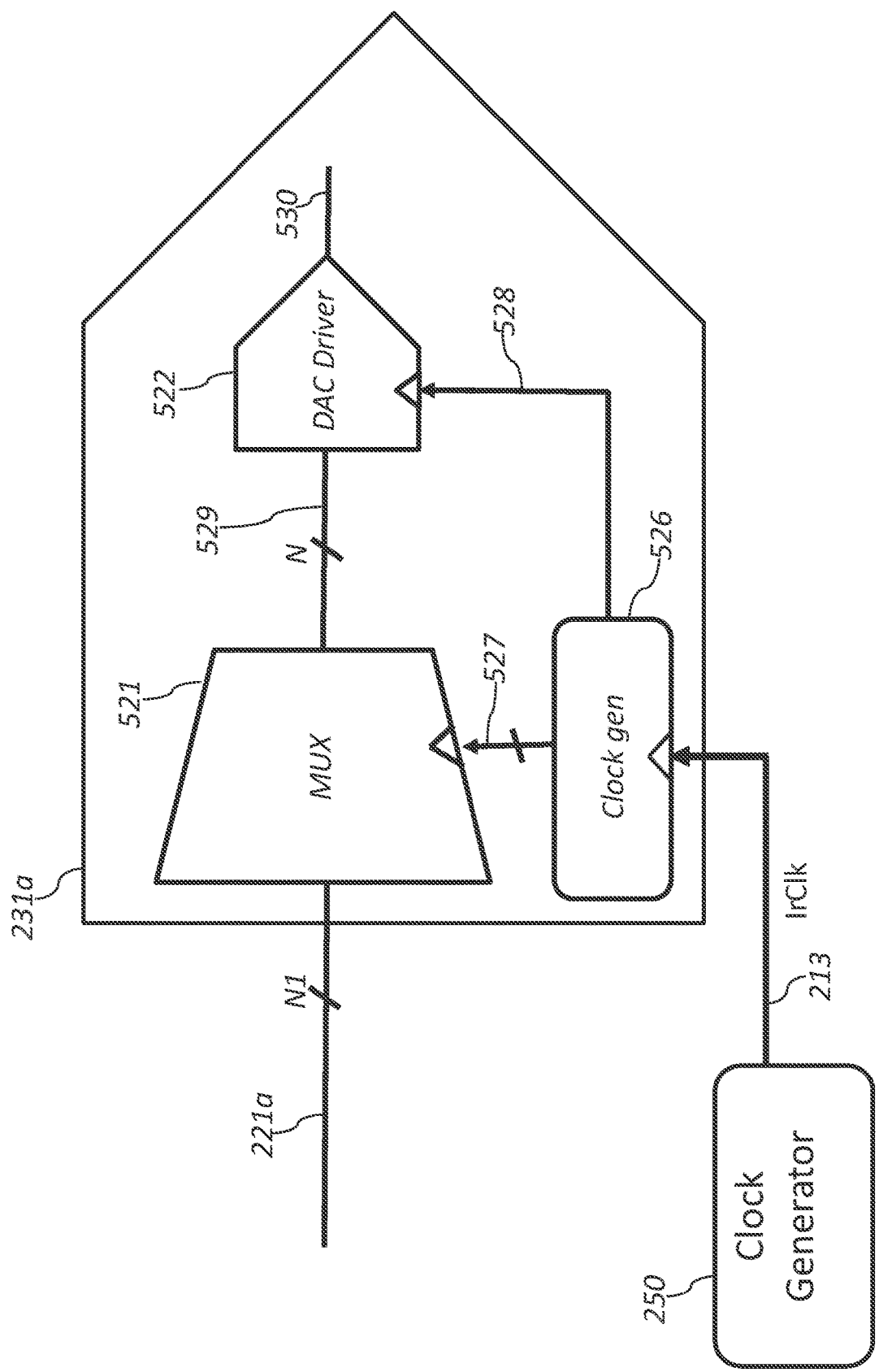

FIG. 5B illustrates an example of an expanded view of a sub-DAC system of FIG. 5A, such as the sub-DAC system 231a of the DAC system 202. The sub-DAC system 231a may be similarly configured and designed as the DAC system 140. As described above, the sub-DAC system 231a includes a MUX circuit, such as the MUX circuit 521, a DAC driver circuit, such as the DAC driver circuit 522, and a clock generator circuit 526. The MUX circuit 521 may be similarly designed or configured as the MUX circuit 111, and the DAC driver circuit 522 may be similarly designed or configured as the DAC driver circuit 110.

The MUX circuit 521 is configured to receive digital baseband signals from the digital pre-coder 510 via the data lines 221a. The MUX circuit 521 may be an up-sampler MUX circuit. The digital baseband signals may be received by the MUX circuit 521 at a first rate or frequency, for example at a baud rate ($F_b$), and the MUX circuit 521 may be configured to convert the received digital baseband signals at the first rate to a digital signal at second rate or frequency, which is a higher rate or frequency than the first rate or frequency, such as a sampling rate ($F_s$). The first rate or frequency may be between 1 MHz to 600 MHz. For example, the first rate or frequency may be a baud rate at 500 MHz. The second rate or frequency may be between 5 GHz to 90 GHz. For example, the second rate or frequency may be at a fraction of a sampling rate of the clock signal 213 received by the clock generator circuit 526. The MUX circuit 521 may be configured to provide or transmit the converted digital signal to the DAC driver circuit 522 via the data lines 529.

As described above, the DAC driver circuit 522 may be similarly configured and/or designed as the DAC driver circuit 110. In some implementations, the DAC driver circuit 522 may be a resistive driver circuit. In some implementations, the DAC driver circuit 522 may be a current steering driver circuit. The DAC driver circuit 522 may be configured to generate an analog signal based on the digital signal received from the MUX circuit 521. The analog signal may be a representation of the values of the bits of the digital signal received from the MUX circuit 521. The DAC driver circuit 522 may include switch 252a. The sampling rate of the DAC driver circuit 521 may be set based on or by the sampling clock signal 528. The switch 252a may be controlled by the clock signal 528. The analog signal provided by the DAC driver circuit 522 may be output via data lines or transmission lines 530 from the DAC driver circuit 522 to another component or a network, such as a combiner circuit, such as combiner circuit 206 (shown in FIG. 5A).

The clock generator circuit 526 may be configured to generate clock signals at a fraction of the sampling rate of the clock signal 213, received from the clock generator circuit 250, and provide the generated clocks signals to the MUX circuit 521 and the DAC driver circuit 522. For example, the clock generator circuit 526 may be configured to generate a clock signal 528 at half the sampling rate of the clock signal 213 and provide the generated clock signals to the DAC driver circuit 522. Similarly, the clock generator circuit 526 may be configured to generate a clock signal at half the sample rate of the received clock signal 213, and further generate a number of clock signals 527 at different fractions of the rate of the clock signal generated at half the sample rate of the received clock signal 213, and provide the number of clock signals 527 to the MUX circuit 521. In one or more examples, the clock generator circuit 250 may provide a clock signal at the full sampling rate. In one or more examples, the clock generator circuit 250 may provide a clock signal at a rate less than the full sampling rate. In one or more examples, the clock generator circuit 526 may generate a clock signal based on the clock signal from the clock generator circuit 250 (e.g., a fraction of the clock signal from the clock generator circuit 250). In one or more examples, if the clock generator circuit 250 provides a clock signal at $F_s$, then the clock generator circuit 526 may provide a clock signal at $F_s/x$, where x is the total number of DAC driver circuits in a conversion device, such as a conversion device 200 or 1300.

In one or more implementations, each sub-DAC system may be configured in a manner similar to the sub-DAC system 231a shown in FIG. 5B but may receive different input signals and different clock signals, and produce different output signals.

Figure 5C:
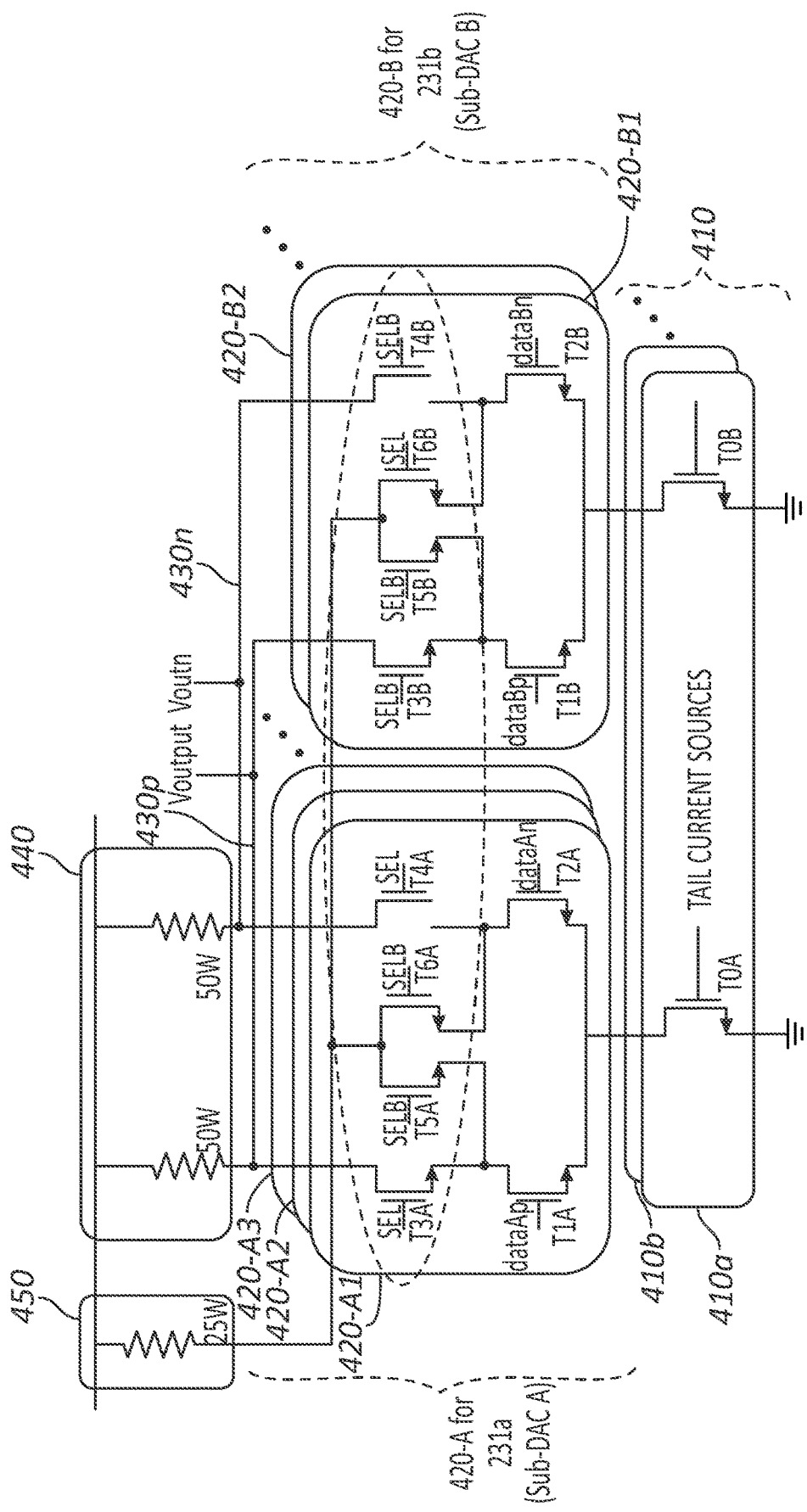

FIG. 5C is a schematic diagram illustrating an example of a portion of a DAC system, such as DAC system 202, whose sub-DAC systems include an example of DAC driver circuits. In FIG. 5C illustrate examples of current steering DAC driver circuits of sub-DAC systems (such as sub-DAC systems 231a and 231b) of a DAC system (such as the DAC system 202). The current steering DAC driver circuit 420-A is included in the sub-DAC system 231a, and the current steering DAC driver circuit 420-B is included in the sub-DAC system 231b. The current steering DAC driver circuit 420-A and the current steering DAC driver circuit 420-B may be utilized as the DAC driver circuits of the sub-DAC systems 231a, 231b, such as two DAC driver circuits 522, 522. The DAC driver circuits 420-A and 420-B may be coupled to tail current sources, such as tail current sources 410a, 410b, a dump network, such as dump network 440. The DAC driver circuit 420-A includes one or more unit cells, such as unit cells 420-A1, 420-A2, 420-A3, etc. The driver circuit 420-B includes one or more unit cells, such as unit cells 420-B1, 420-B2, etc. The DAC driver circuits 420-A and 420-B are not limited to the number of unit cells shown in FIG. 5C.

The number of unit cells in DAC driver circuit 420-A may equal the number of unit cells in DAC driver circuit 420-B. Each unit cell includes data switches and cascode devices. In FIG. 5C, each unit cell of DAC driver circuit 420-A is a differential cell and includes two data switches (e.g., transistors T1A and T2A) and four cascode devices (e.g., transistors T3A, T4A, T5A and T6A), and similarly each unit cell of DAC driver circuit 420-B is a differential cell and includes two data switches (e.g., transistors T1B and T2B) and four cascode devices (e.g., transistors T3B, T4B, T5B and T6B). Two of the cascode devices (e.g., T3A and T4A) from each unit cell may be connected to the load network 440 and the other two of the cascode devices (e.g., T5A and T6A) may be connected to the dump network 440. Each unit cell of the DAC driver circuit 420-A is coupled through its respective tail transistor (T0A) of the current source 410 to the ground potential. Similarly, each unit cell of the DAC driver circuit 420-B is coupled through its respective tail transistor (T0B) of the current source 410 to the ground potential. In an aspect, the current steering DAC driver circuit includes N unit cells for DAC driver circuit 420-A, N unit cells for DAC driver circuit 420-B, and N tail current sources (410a, 410b, etc.). In one or more examples, N is the number of input data lines to the current-steering DAC driver circuits 420A, 420B.

For DAC driver circuit 420-A, the data switch T1A may receive a dataAp signal at a gate terminal of the data switch T1A, and the data switch T2A may receive a dataAn signal. The dataAp and dataAn signals may be complementary to each other. For DAC driver circuit 420-B, the data switch T1B may receive a dataBp signal at a gate terminal and the other of the data switch T2B may receive a dataBn signal. The dataBp and dataBn signals may be complementary to each other. The dataAp, dataAn, dataBp and dataBn signals may be based on the N bits received by the current steering DAC driver circuits 420-A, 420-B. The combination of the two signal sets dataAp/dataAn and dataBp/dataBn are used to form the desired differential analog signal provided to the load network 440.

The cascode devices in each unit cell may be on or off depending on the clock phases SEL and SELB. The clock phases SEL and SELB may be referred to as selection signals or interleaving clock signals. The clock phases SEL and SELB are complementary to one another such that when one is in a high state (logic "1"), the other is in a low state (logic "0"). For DAC driver circuit 420-A, when the clock phase SEL is in the high state (i.e., the clock phase SELB is in the low state), the cascode devices T3A and T4A biased by the clock phase SEL are switched on and can tie the data switches T1A and T2A to the load network 440, whereas the cascode devices T5A and T6A biased by the clock phase SELB are switched off and do not connect the data switches T1A and T2A to the dump network 450. In this aspect, for DAC driver circuit 420-B, the cascode devices T5B and T6B biased by the clock phase SELB are switched off and do not tie the data switches T1B and T2B to the load network 440, whereas the cascode devices T5B and T6B biased by the clock phase SEL are switched on and can tie the data switches to the dump network 450. DAC driver circuit 420-A is referred to as being active and DAC driver circuit 420-B is referred to as being inactive in the above scenario (SEL is high and SELB is low). In this regard, the current from DAC driver circuit 420-A is steered to the load network, and the output 430p and/or 430n of the DAC system 202 is based on the current from DAC driver circuit 420-A. In contrast, when the clock phase SEL is in the low state (i.e., the clock phase SELB is in the high state). DAC driver circuit 420-A is inactive and DAC driver circuit 420-B is active. In this case, the current from DAC driver circuit 420-B is steered to the load network 440, and the output 430p and/or 430n of the DAC system 202 is based on the current from DAC driver circuit 420-B. In one aspect, SEL may be one of I-clk2, IB-clk2, Q-clk2, or QB-clk2. In one aspect, if SEL is I-clk2, then SELB may be IB-clk2, and vice versa. In one aspect, if SEL is Q-clk2, then SELB may be QB-clk2, and vice versa.

Figure 5D:
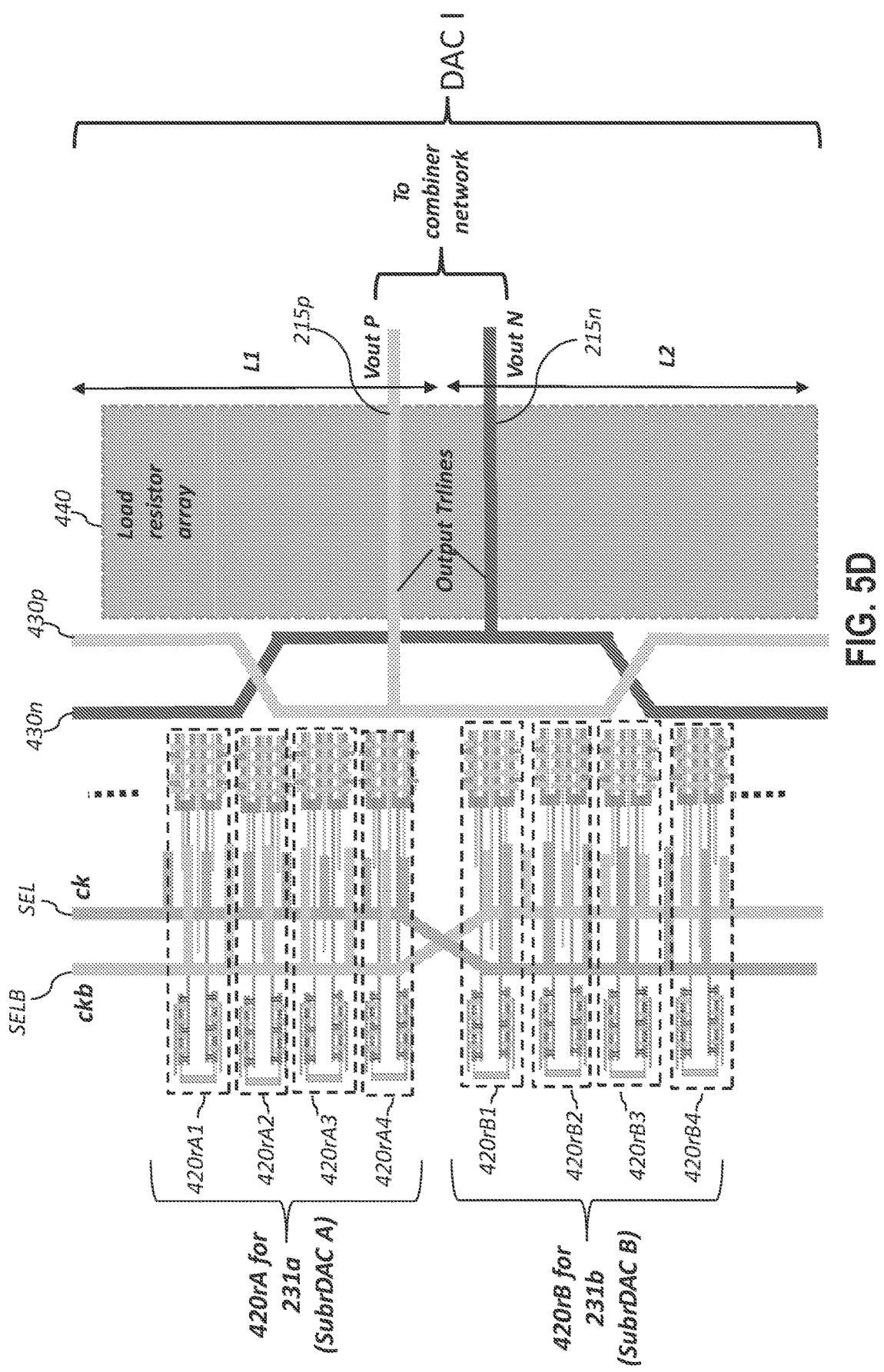

In some implementations, the unit cells of the DAC driver circuits may be adjacently located and/or positioned. For example, the unit cells 420-A1, 420-A2, 420-A3, etc. of DAC driver circuit 420-A may be laterally and adjacently located or positioned to each other, as shown in FIG. 5D. Similarly, the unit cells 420-B1, 420-B2, etc. of DAC driver circuit 420-B may be laterally and adjacently positioned or located to each other, as shown in FIG. 5D. Additional details of the location and/or positioning of the unit cells are described below with reference to FIG. 5D. While FIG. 5C is illustrated with respect to the sub-DAC systems 231a, 231b, similar configuration and description apply to the sub-DAC systems 232a, 232b.

FIG. 5D is a floorplan schematic diagram illustrating an example of a portion of a DAC system, such as the DAC system 202. The unit cells of the sub-DAC systems 231a, 231b, are positioned laterally and located next to each other. As shown in FIG. 5D, the unit cells 420-A1, 420-A2, 420-A3, 420-A4 of DAC driver circuit 420-A of sub-DAC system 231a are laterally positioned or located adjacent to at least another unit cell of the DAC driver circuit of the sub-DAC system 231a. Similarly, the units cells 420-B1, 420-B1, 420-B3, 420-B4 of DAC driver circuit 420-B of sub-DAC system 231b are laterally positioned or located adjacent to at least another unit cell of the DAC driver circuit of the sub-DAC system 231b. The unit cells of the DAC driver circuits 420-A and 420-B may also be located adjacent to and coupled to the output or transmission lines of the DAC system 202, such as the transmission lines 430n and 430p. The length of the transmission lines 430n and 430p may be dependent on the number of unit cells of the sub-DAC systems 231a and/or 231b. In some implementations, the length, L1, L2, of the transmission lines 430n and 430p may be dependent on the number of unit cells in the DAC driver circuits of sub-DAC systems 231a, 231b. For example, the length L1 of the transmission lines 430n and 430p may be dependent on the number of unit cells in the sub-DAC system 231a. Similarly, the length L2 of the transmission lines 430n and 430p may be dependent on the number of unit cells in the sub-DAC system 231b. In some implementations, each of the lengths L1, L2 of the transmission lines 430n and 430p may be in the range of 5 to 100 microns. In one or more examples, each of L1 and L2 may be between 40 microns and 80 microns. In one or more examples, each of L1 and L2 may be between 60 microns and 80 microns. In one or more examples, each of L1 and L2 may be between 40 microns and 60 microns. In some implementations, each of the transmission lines 215p, 215n is located between and coupled to the transmission line 430p, 430n, respectively, and the combiner circuit 206. In one or more examples, the length of each of the transmission lines 215p, 215n may be about 1 millimeter. While FIG. 5D is illustrated with respect to the DAC system 202 and the sub-DAC systems 231a, 231b, similar configuration and description apply to the DAC system 203 and the sub-DAC systems 232a, 232b. In one or more aspects, the dump network 450, the load network 440, and the source current 410 may be described as part of the DAC driver circuits 420-A and 420-B.

FIG. 6 illustrates an example of clock signals of 50% duty cycle. In an aspect, the clock signals may be provided to the sub-DAC systems of FIG. 5A. For instance, the four clock signals Clk I, Clk IB, Clk Q, and Clk QB may be the clock signals I-clk2 clock signal 218a, IB-clk2 clock signal 218b, Q-clk2 clock signal 217a, and QB-clk2 clock signal 217b, respectively, shown in FIG. 5A. The Clk I and Clk IB may be complementary (e.g., 180° out of phase). Similarly, the Clk Q and Clk QB may be complementary. In an aspect, the Clk I and Clk Q clock signals (and/or Clk IB and Clk QB clock signals) may be referred to as quadrature clock signals. The Clk I and Clk Q clock signals may be overlapping clock signals, such that both the clock signals may be in a high state or a low state at the same time. Similarly, the Clk IB and Clk QB clock signals may be overlapping clock signals. In an aspect, when a full sampling rate of the conversion system is given by $F_S$, the clock frequency of the clock signals Clk I, Clk IB, Clk Q, and Clk QB is $F_S/2$.

FIG. 7 illustrates an example of clock signals of 25% duty cycle. The clock signals Clk A, Clk B, Clk C, and Clk D may be non-overlapping clock signals. In an aspect, the clock signals Clk A, Clk B, Clk C, and Clk D may be provided to the sub-DAC systems of FIG. 5A. As an example, the four clock signals Clk A, Clk B, Clk C, and Clk D may be the clock signals I-clk2, Q-clk2, IB-clk2, and QB-clk2, respectively, shown in FIG. 5A. Although FIGS. 6 and 7 are described herein with respect to the sub-DAC systems of FIG. 5A, the clock signals of FIGS. 6 and 7 may also be applied to other DAC systems and/or sub-DAC systems.

In some aspects, the clock signals Clk I, Clk IB, Clk Q, and Clk QB of FIG. 6 may be utilized to generate the clock signals Clk A, Clk B, Clk C, and Clk D of FIG. 7. In an aspect, the clock signals Clk I, Clk IB, Clk Q, and Clk QB may be referred to as overlap sampling clocks or overlap sampling clock phases and the clock signals Clk A, Clk B, Clk C, and Clk D may be referred to as carved quadrature clocks or carved quadrature clock phases.

FIG. 8A illustrates an example of conversion of overlap sampling clock signals to carved quadrature clock signals. A combinatorial logic circuit may receive the overlap sampling clock signals as input and generate as output the carved quadrature clock signals. By way of non-limiting example, the combinatorial logic circuit may include one or more of NAND gate(s), XOR gate(s), XNOR gate(s), among other logic gates. FIG. 8B illustrates examples of frequency responses associated with the overlap sampling clock signals and the carved quadrature clock signals of FIG. 8A. In an aspect, utilization of the overlap sampling clocks may be associated with lower system bandwidth (e.g., due to a lower sinc(x) rolloff) relative to utilization of the carved quadrature clock signals. As shown in FIG. 8B, when $f_c$ denotes a clock rate associated with the clock signals Clk I, Clk IB, Clk Q, and Clk QB, a first null of the frequency response $H_1(f)$ associated with using these clock signals may occur at $2f_c$. When the clock signals Clk A, Clk B, Clk C, and Clk D are used, a first null of the frequency response $H_2(f)$ associated with using these clock signals may occur at $4f_c$. Thus, the utilization of the clock signals Clk A, Clk B, Clk C, and Clk D may extend (e.g., double) the bandwidth associated with the conversion device.

FIG. 9 illustrates an example of a combinatorial logic circuit for converting the overlap sampling clock signals to the carved quadrature clock signals. In FIG. 9, the combinatorial logic circuit includes four AND gates. For instance, a first AND gate may be used to take as input Clk I and Clk QB and generate as output Clk A. Similarly, each of the clock signals Clk B, Clk C, and Clk D may be generated using an AND gate based on a logic sum of two of the clock signals Clk I, Clk IB, Clk Q, and Clk QB. Although FIG. 9 illustrates one example of a combinatorial logic circuit, other manners by which to generate the carved quadrature clock signals from the overlap sampling clock signals may be utilized. In some aspects, the combinatorial logic circuit, including that shown in FIG. 9, may be implemented using, for example, a complementary metal-oxide-semiconductor (CMOS) approach or common mode logic (CML) approach. The approach that is utilized may be based, for instance, on desired swing levels. In some cases, the overlap sampling clock signals (associated with higher duty cycle) may be easier to route than the quadrature clock signals.

Figure 10:
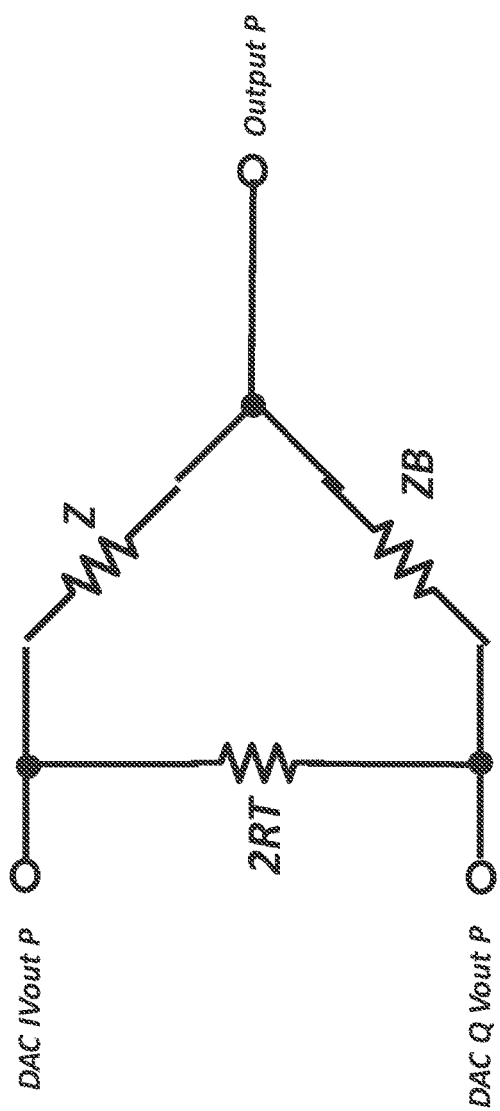
FIGS. 10 and 11 illustrate examples of a combiner network.

FIG. 10 illustrates an example of a combiner network, a combiner or a combiner circuit, such as the combiner circuit 206. As described above, a combiner network, a combiner, or a combiner circuit may be a power combiner network, a power combiner, a power combiner circuit. As described above, the combiner circuit may be utilized to combine (e.g., generate a sum of) signals (e.g., voltage, current, and/or power signals) from two DAC systems. For instance, an input to the combiner circuit may be coupled to an output, such as output 430$p$ (Vout P) of the DAC system 202 of FIG. 5A. Similarly, another input to the combiner circuit may be coupled to an output, such as output 430$p$, of the DAC systems 203 of FIG. 5A. In some implementations, an impedance of the DAC system 202 at a first input node (e.g., DAC I Vout P) is configured to match an impedance of the combiner circuit at the first input node. An impedance of the DAC system 203 at a second input node (e.g., DAC Q Vout P) is configured to match an impedance of the combiner circuit at the second input node. An impedance of the combiner circuit at its output node is configured to match an impedance of a load at the output node. In an aspect, an output of the combiner circuit may be coupled to a T-coil. The T-coil may be utilized to boost frequency. In an aspect, the combiner circuit of FIG. 10 may be a Wilkinson network. In an aspect, resistive elements Z and $Z_B$ may be implemented using transmission lines (e.g., of a certain characteristic impedance) or with reactance devices (e.g., inductors).

Figure 11:
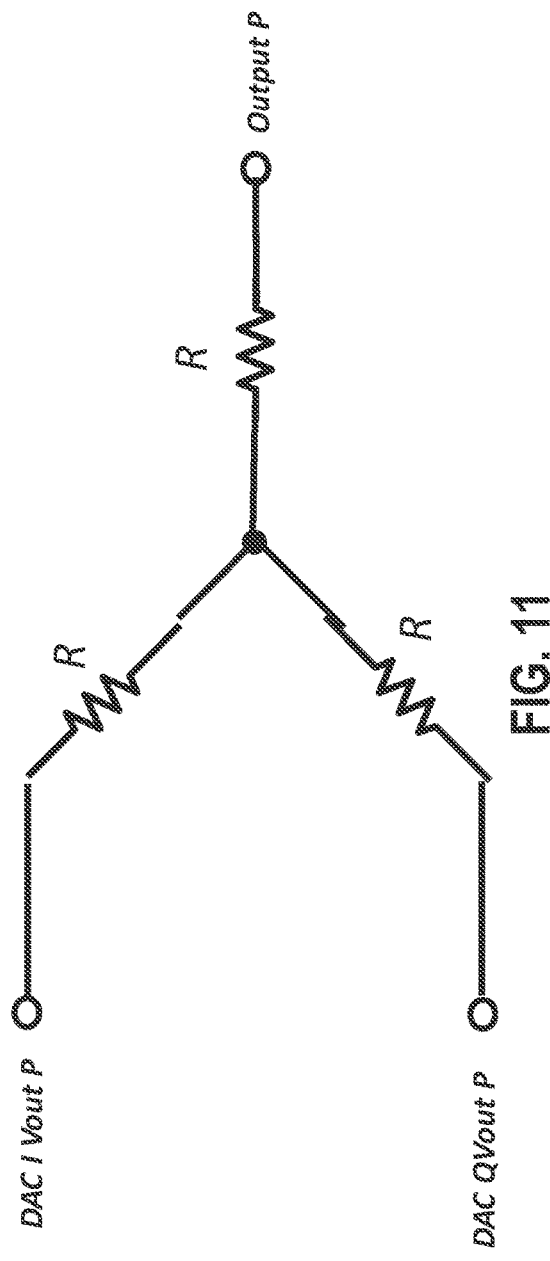

FIG. 11 illustrates another example of a combiner circuit. The description from FIG. 10 generally applies to FIG. 11. Although FIGS. 10 and 11 are described as being utilized for the DAC systems and sub-DAC systems of FIG. 5A, the combiner circuits of FIGS. 10 and 11 may also be applied to other DAC systems and/or sub-DAC systems.

While FIGS. 10 and 11 illustrate one side (i.e., a p-side) of differential circuits, the other side of the differential circuits (i.e., a n-side) has similar circuits configured in a similar manner. For example, a first input node of an n-side combiner circuit is coupled to an output, such as output 430$n$ (Vout N) of the DAC system 202. A second input node of the n-side combiner circuit is coupled to an output, such as output 430 of the DAC system 203. An output node (Output N) of the n-side combiner circuit may be coupled to a load. The impedance of each of the DAC systems 202, 203 at the respective input node matches the impedance of the n-side combiner circuit at the respective input node. The impedance of the n-side combiner circuit matches the impedance of the load at the output node.

Although the foregoing description is with reference to combiner circuits that combine signals from two DAC systems, the combiner circuits may be utilized to combine signals from more than two DAC systems in some cases. Although FIGS. 5C, 5D, 10 and 11 illustrate differential circuits, in one or more implementations, the subject technology is applicable to not only to differential circuits but also to single-ended circuits.

Figure 12:
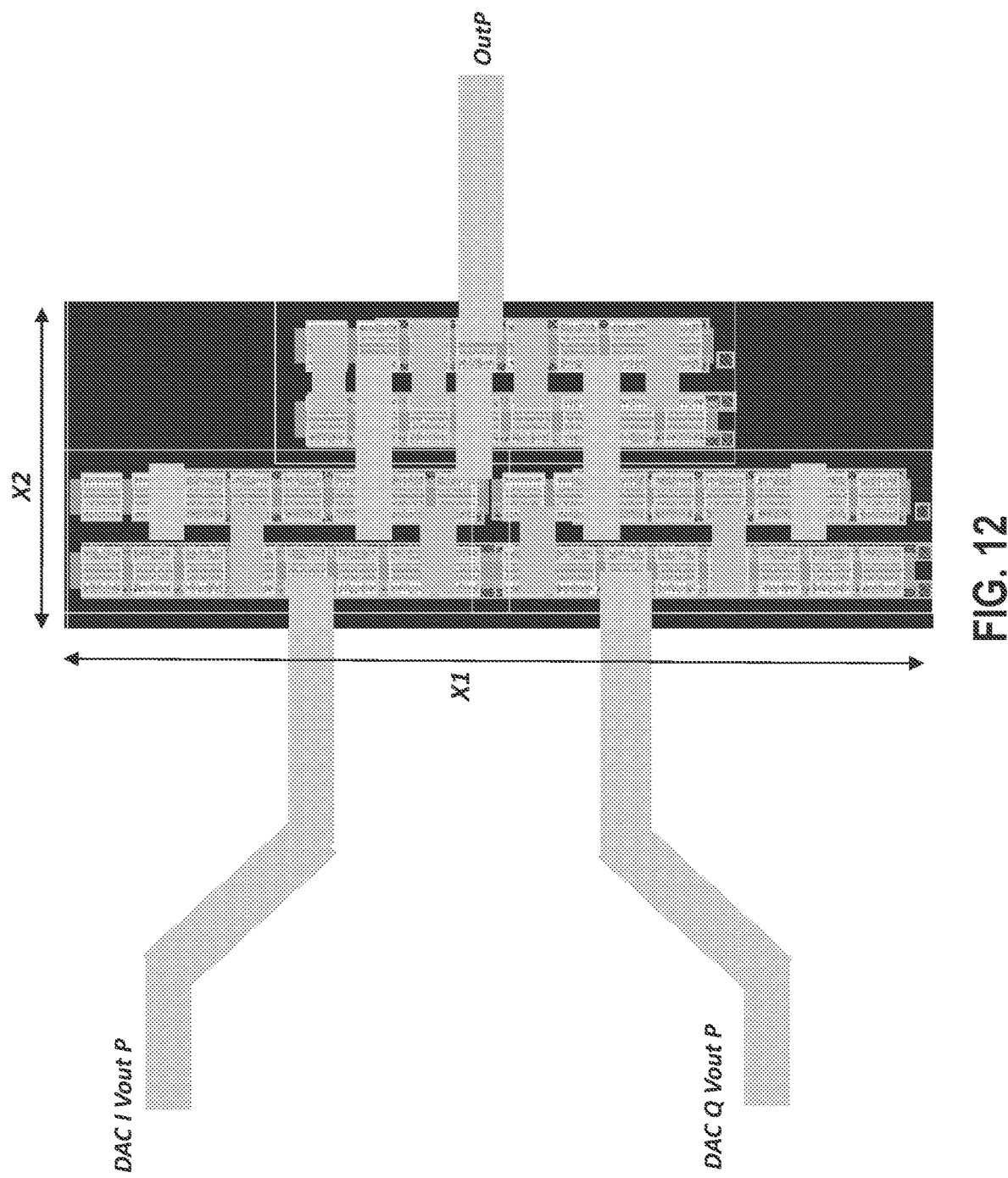
FIG. 12 illustrates a floorplan schematic diagram of a combiner circuit.
Figure 14:
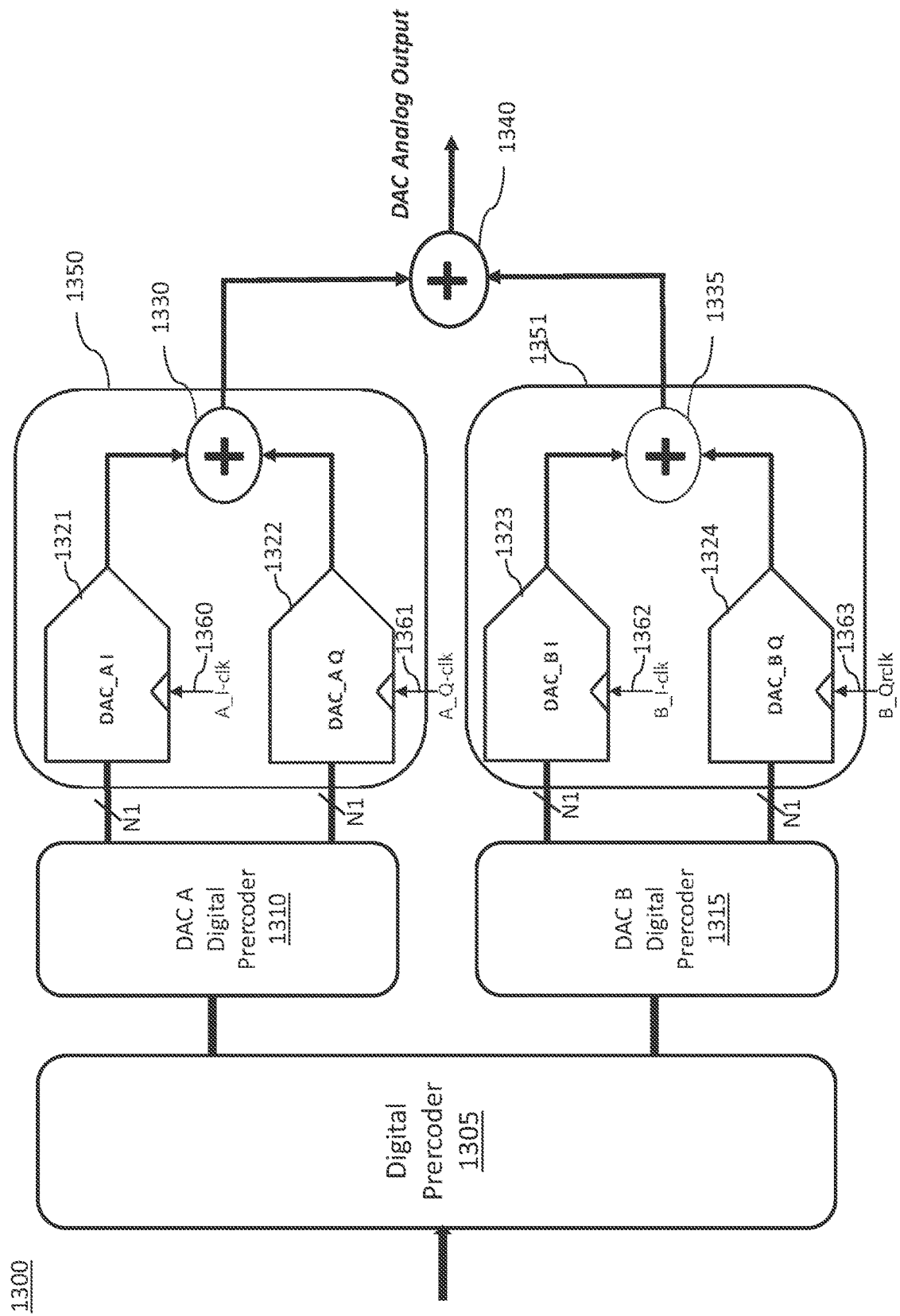
FIG. 14 illustrates an example of a conversion device that includes multiple hierarchical levels/layers of digital pre-coder circuits and DAC systems.

FIG. 12 is a floorplan schematic diagram illustrating an example of a combiner circuit, such as the combiner circuit 206. The combiner circuit may have dimensions of X1 by X2. The length of X1 may be within a range of 10 to 80 microns, and the length of X2 may be within a range of 2 to 30 microns. For example, the length X1 may be 60 microns and the length X2 may be 20 microns. As shown in FIG. 12, an input of the combiner circuit is coupled to an output of a DAC system, such as the output 430$p$ of the DAC system 202, and an input of the combiner circuit is coupled to an output of another DAC system, such as an Vout P output of the DAC system 203. The combiner circuit may be configured to combine the received outputs of the DAC systems, such as Vout P, and generate another output signal. The output of the combiner circuit may be provided to another combiner circuit, as shown in FIG. 14, or may be provided to another load network. While FIG. 12 illustrates a p-side of the differential circuits, an n-side of the differential circuits is configured in a similar manner but for n-side inputs and output.

Figure 13:
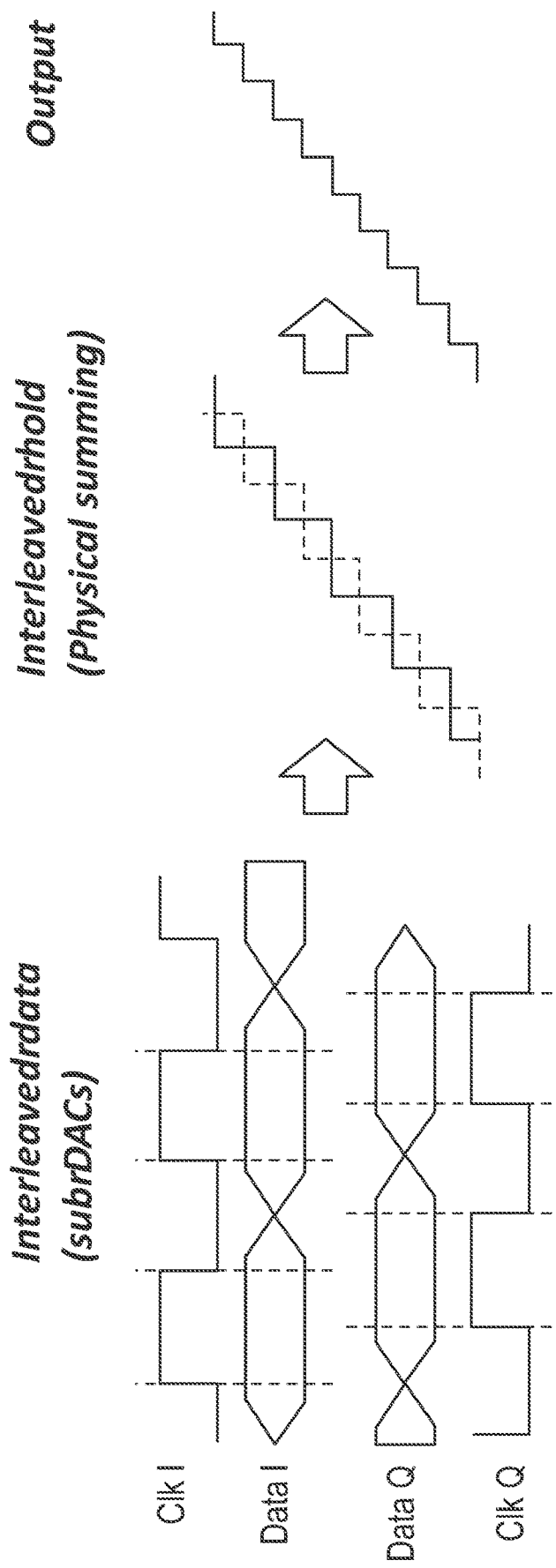
FIG. 13 illustrates an example of generating data for multiple DAC systems and combining outputs of the DAC systems.

FIG. 13 illustrates an example of generating data for multiple DAC systems and combining outputs of the DAC systems. In an aspect, digital pre-coding may be utilized to generate one or more sets of I and/or Q data for the DAC system(s). As one example, such as with respect to the conversion device of FIG. 5A, the DAC I system 202 utilizes two sub-DAC A and B systems 231$a$, 231$b$ and generates interleaved Data I signal, and the DAC Q system 203 utilizes two sub-DAC C and D systems 232$a$, 232$b$ and generates interleaved Data Q signal. The Data I and Data Q signals, may be combined (e.g., physically summed or interleaved-hold without interleaving the data signals) by the combiner circuit 206 to generate an output signal.

FIG. 14 illustrates an example of a conversion device 1300 that includes multiple hierarchical levels/layers of digital pre-coder circuits and DAC systems. A digital pre-coder circuit 1305 may receive a digital input signal and generate a respective digital output signal to each of a digital pre-coder circuit 1310 and 1315. The digital pre-coder circuit 1310 and 1315 may operate in parallel with one another. The digital pre-coder circuit 1310 may generate, based on the signal received from the digital pre-coder circuit 1305, N1-bit in-phase digital signals and N1-bit quadrature digital signals. The digital pre-coder circuit 1310 may provide the N1-bit in-phase signals to a DAC system 1321 (DAC_A I system) and the N1-bit quadrature signals to a DAC system 1322 (DAC_A Q system). The digital pre-coder circuit 1315 may generate, based on the signal received from the digital pre-coder circuit 1305, N1-bit in-phase signals and N1-bit quadrature signals and provide these signals to a DAC system 1323 (DAC_B I system) and a DAC system 1324 (DAC_B Q system), respectively. The DAC systems 1321 and 1322 may be associated or grouped or positioned near each other to form a DAC module 1350. The DAC module 1350 is similarly configured and designed as the DAC module 501 of FIG. 5A. The DAC systems 1323 and 1324 may be associated or grouped or positioned near each other to form a DAC module 1351. The DAC module 1351 is similarly configured and designed as the DAC module 501 of FIG. 5A. The DAC system 1321 (DAC_A I system), DAC system 1322 (DAC_A Q system), DAC system 1323 (DAC_B I system), and DAC system 1324 (DAC_B Q system) may receive a clock signal 1360 (A_I-clk), 1361 (A_Q-clk), 1362 (B_I-clk), and 1363 (B_Q-clk), respectively.

In some implementations, the digital pre-coder circuit 1305 may comprise the digital pre-coder circuits 1310 and 1315 so that the digital pre-coder circuit 1305 may be directly coupled to the DAC systems 1321 and 1322 or the DAC module 1350 and may be directly coupled to the DAC systems 1323 and 1324 or the DAC module 1351. In such implementations, a single digital pre-coder circuit 1305 may be utilized and the single digital pre-coder circuit 1305 may be configured to generate, based on an input signal received, N1-bit in-phase and N1-bit quadrature digital signals, and provide the N1-bit in-phase signals to DAC system 1321 (DAC_A I system) and the N1-bit quadrature signals to the DAC system 1322 (DAC_A Q system). Similarly, the digital pre-coder circuit 1305 may be configured to generate, based on the input signal received, N1-bit in-phase signals and N1-bit quadrature signals and provide these signals to a DAC system 1323 (DAC_B I system) and a DAC system 1324 (DAC_B Q system), respectively. When the digital pre-coder circuit 1305 receives a digital input signal, the signal provided to the DAC module 1350 may be based on a first portion of the digital input signal, and the signal provided to the DAC module 1351 may be based on a second portion of the digital input signal, where the second portion is different from the first portion.

A combiner circuit 1330 may combine outputs of the DAC systems 1321 and 1322 (DAC_A I and DAC_A Q systems). Similarly, a combiner circuit 1335 may combine outputs of the DAC systems 1323 and 1324 (DAC_B I and DAC_B Q systems). A combiner circuit 1340 may combine outputs of the combiner circuits 1330, 1335 to generate a DAC analog output of the conversion device 1300. In one aspect, the combiner circuit 1340 combines signals from the combiner circuits 1330, 1335 of the DAC modules 1350, 1351 without interleaving.

In some aspects, the clock signals 1360 and 1361 (A_I-clk and A_Q-clk) may be utilized to generate a set of four overlap sampling clocks (e.g., the clock signals Clk I, Clk IB, Clk Q, and Clk QB clock signals shown in FIG. 6). Similarly, the clock signals 1362 and 1363 (B_I-clk and B_Q-clk) may be utilized to generate a set of four overlap sampling clocks. In some aspects, the clock signals 1360 and 1361 (A_I-clk and A_Q-clk) may be utilized to generate a set of four carved quadrature clocks (e.g., the clock signals Clk A, B, C, and D shown in FIG. 7). Similarly, the clock signals 1362 and 1363 (B_I-clk and B_Q-clk) may be utilized to generate a set of four carved quadrature clocks. In some aspects, the overlap sampling clocks may be generated, and then carved quadrature clocks may be generated based on the overlap sampling clocks.

In an aspect, each of the DAC_A I system, DAC_A Q system, DAC_B I system, and DAC_B Q system is controlled by two complementary clock signals. In an aspect, when a full sampling rate of the conversion device 1300 is given by $F_S$, the digital pre-coder circuit 1310 and 1315 may be $F_b$, and each of A_I-clk, A_Q-clk, B_I-clk and B_Q-clk of the DAC_A I, DAC_A Q, DAC_B I, and DAC_B Q systems may be $F_S/2$. In an aspect, the conversion device 1300 includes eight sub-DAC systems (e.g., two sub-DAC systems for each of the four DAC systems), and the clock signal of each sub-DAC system may be associated with a duty cycle of 25% or $F_S/4$.

Although FIG. 14 illustrates a parallelization/hierarchical structure that utilizes two in-phase DAC systems and two quadrature DAC systems that may operate in parallel, extension/scaling of the hierarchical structure to include more than two in-phase DAC systems and two quadrature DAC systems may be utilized. In an aspect, utilization of more I and Q DAC systems may facilitate higher speed operation of the conversion device 1300.

In one or more aspects, the subject technology may utilize an interleave-hold scheme of one pair of DAC systems (e.g., FIG. 5A) or two pairs of DAC systems (e.g., FIG. 14). Each DAC system may be comprised of multiple sub-DAC systems. In one example, each of the sub-DAC systems may be running at a half rate (e.g., $F_S/2$) of an intended full rate (e.g., $F_S$). In another example, each of the sub-DAC systems may be running at a quarter rate (e.g., $F_S/4$) of an intended full rate (e.g., $F_S$). In an aspect, the sub-DAC systems may be implemented using a current approach, a resistive approach, or a hybrid combination of the current and resistive approaches. In an aspect, each DAC system is comprised of two sub-DAC systems that are interleaved-data. The sub-DAC systems may be referred to as being in a lower level than the DAC system. In one or more implementations, the DAC systems at the higher levels (e.g., DAC I, DAC Q of FIG. 4A) are not interleaved, but may be connected (e.g., physically connected) via a resistive network or a combiner circuit (e.g., power combiner circuit). Such connection(s) may represent an interleaved-hold operation. In an aspect, the techniques of interleaved-data and interleaved-hold may be combined to achieve a high sampling rate (e.g., a ultra-high sampling rate).

In an aspect, an on-chip combiner circuit may be utilized at an output of the conversion device to sum two analog data (e.g., from DAC systems). The combiner circuit may be an on-chip hybrid power combiner circuit. In some cases, the combiner circuit may be a power combiner circuit, such as a Wilkinson or resistive network. In an aspect, digital pre-coding at the baseband may allow generation of the I-Q DAC data. An interleave-hold strategy may be utilized to allow overlapping of the data of the pair of DACs to form an actual data at the output.

In an aspect, due to the interleaving nature/architecture associated with the DAC systems, an overlap sampling clock scheme (an example of which is shown in FIG. 6) and/or a carved quadrature clock scheme (an example of which is shown in FIG. 7) may be utilized. In some cases, the carved quadrature clocks may be generated from the overlap sampling clocks using a set of combinatorial logic gates. In an aspect, the interleaving architecture may allow for lower quantization noise.

In one or more implementations, a conversion device (e.g., conversion device 200, 400, 1300) may have a full sampling rate or frequency greater than 1 GHz. In one or more examples, a conversion device's full sampling rate may be between 10 GHz and 100 GHz. In one or more examples, a conversion device's full sampling rate may be between 10 GHz and 60 GHz. In one or more examples, a conversion device's full sampling rate may be between 20 GHz and 60 GHz. In one or more examples, a conversion device's full sampling rate may be 32 GHz. In one or more examples, a conversion device's full sampling rate may be 64 GHz.

In one or more implementations, a conversion device may be an N-bit conversion device. In one or more implementations, a DAC driver circuit may be an N-bit DAC driver circuit. N may be an integer greater than 1. In one or more examples, N may be between 4 and 16 bits. In one or more examples, N may be between 8 and 12 bits. In one or more examples, N may be 10 bits. In one or more examples, N may be 12 bits.

In some implementations, circuits or components of a DAC system may be fabricated using a process technology (or a submicron process technology) between 6 nanometers (nm) and 40 nm. In one or more examples, a process technology may be 7 nm or 14 nm. In other one or more examples, a process technology may be 20 nm, 22 nm, 28 nm, 32 nm, etc. In one or more implementations, when a process technology is between 6 nm and 40 nm, the gate length of a transistor in a DAC system may be between 6 nm and 40 nm, respectively. In one or more examples, the gate length of a transistor in a DAC system may be 7 nm when and the transistor is fabricated using the 7 nm process technology. In one or more examples, the gate length of a transistor in a DAC system may be 14 nm. In other one or more examples, the gate length of a transistor in a DAC system may be 20 nm, 22 nm, 28 nm, 32 nm, etc. As used in this paragraph only, a DAC system may be, but not limited to, each DAC module, DAC modules, each DAC system, DAC systems, each sub-DAC system, sub-DAC systems, each DAC driver circuit, or DAC driver circuits, and a transistor may be, but not limited to, each transistor or transistors.

In one or more implementations, the length of a transmission line associated with a DAC system may be based on the number of bits of a conversion device (e.g., the number of bits of a DAC system, a sub-DAC system, or a DAC driver circuit). In one or more examples, as the number of bits increases, the number of DAC unit cells increases. As a result, the length of a transmission line may increase. In some aspects, the length of a transmission line is based on the number of DAC unit cells. In one or more examples, as the sampling rate or frequency increases (e.g., greater than or equal to 10 GHz, 20 GHz, 32 GHz, 60 GHz, or 64 GHz), the time delay, signal reflection, distortion and/or spurs may be significantly impacted by the length of the transmission line (e.g., a length greater than or equal to 40 microns, 50 microns, 60 microns, 75 microns, or 80 microns). In one or more aspects, the impedance matching among the DAC systems, the combiner circuit, and its load described herein significantly reduces the time delay, signal reflection, distortion and/or spurs.

Various examples of aspects of the disclosure are described below as clauses for convenience. These are provided as examples, and do not limit the subject technology.

Clause A: A digital-to-analog converter (DAC) apparatus (e.g., 200, 500, 1300) for a ultra-high speed operation having a full sampling frequency of 1 GHz or higher for interleaving data using multiple sub-DAC systems, followed by combining the interleaved data using a power combiner network without interleaving, wherein the DAC apparatus includes one or more digital pre-coders (e.g., 201, 510*a*, 510*b*, 1305, 1310, 1315) configured to process digital signals and multiple DAC modules (e.g., 501, 1350, 1351) coupled to the one or more digital pre-coders. Each of the multiple DAC modules includes a first current-mode DAC system (e.g., 202, 203, 1321, 1322, 1323, 1324) comprising a first sub-DAC system (e.g., 231*a*, 231*b*, 232*a*, 232*b*) and a second sub-DAC system (e.g., 231*a*, 231*b*, 232*a*, 232*b* that is associated with, but not, the first sub-DAC system); a second current-mode DAC system (e.g., 202, 203, 1321, 1322, 1323, or 1324 that is associated with, but not, the first current-mode DAC system) comprising a third sub-DAC system (e.g., 231*a*, 231*b*, 232*a*, 232*b* that is not the first or second sub-DAC system) and a fourth sub-DAC system (e.g., 231*a*, 231*b*, 232*a*, 232*b* that is associated with, but not, the third sub-DAC system); and a first power combiner network (e.g., 206, 1330, 1335) comprising a first input node, a second input node, and an output node, wherein the first power combiner network is coupled to the first current-mode DAC system at the first input node and coupled to the second current-mode DAC system at the second input node. The first current-mode DAC system comprises a first transmission line (e.g., 430*p*, 430*n*) coupled to the first and second sub-DAC systems and the first power combiner network, wherein the first transmission line has a length greater than 10 microns. The second current-mode DAC system comprises a second transmission line coupled to the third and fourth sub-DAC systems and the first power combiner network, wherein the second transmission line has a length greater than 10 microns. The first current-mode DAC system is configured to generate, a first interleaved analog signal, based on a first analog signal from the first sub-DAC system and a second analog signal from the second sub-DAC system. The second current-mode DAC system is configured to generate, a second interleaved analog signal, based on a third analog signal from the third sub-DAC system and a fourth analog signal from the fourth sub-DAC system. The first power combiner network is configured to combine, without interleaving, the first interleaved analog signal received via the first transmission line and the second interleaved analog signal received via the second transmission line, and output a combined analog signal. An impedance of the first current-mode DAC system at the first input node is configured to match an impedance of the first power combiner network at the first input node. An impedance of the second current-mode DAC system at the second input node is configured to match an impedance of the first power combiner network at the second input node. An impedance of the first power combiner network at the output node is configured to match an impedance of a load at the output node. The DAC apparatus includes a second power combiner network (e.g., 1340) comprising a third input node, a fourth input node, and a second output node, wherein the second power combiner network is coupled to the first power combiner network of each of at least two of the multiple DAC modules. The second power combiner network is configured to combine, without interleaving, the combined analog signals from at least two of the multiple DAC modules. An impedance of a first one of the multiple DAC modules at the third input node is configured to match an impedance of the second power combiner network at the third input node. An impedance of a second one of the multiple DAC modules at the fourth input node is configured to match an impedance of the second power combiner network at the fourth input node. An impedance of the second power combiner network at the second output node is configured to match an impedance of a load at the second output node.

Clause B: The DAC apparatus of any of the clauses, wherein the first sub-DAC system comprises a clock generator circuit and a DAC driver circuit, the clock generator circuit configured to provide a clock signal to the DAC driver circuit at a frequency equal to or greater than 10 GHz.

Clause C: The DAC apparatus of any of the clauses, wherein the first sub-DAC system comprises a multiplexer, the multiplexer configured to receive multiple clock signals from the clock generator circuit, wherein a frequency of each of the multiple clock signals is less than the frequency of the clock signal provided to the DAC driver circuit.

Clause D: The DAC apparatus of any of the clauses, wherein the DAC driver circuit comprises multiple DAC unit cells, wherein the multiple DAC unit cells are positioned adjacent to each other, located along the length of the first transmission line, and coupled to the first transmission line.

Clause E: The DAC apparatus of any of the clauses, wherein the length of the first transmission line is based on the number of the multiple DAC unit cells.

Clause F: The DAC apparatus of any of the clauses, wherein the second power combiner network comprises passive components without active components.

Clause G: The DAC apparatus of any of the clauses, wherein each of the first power combiner network and the second power combiner network is configured to operate in voltage-mode.

Clause H: A digital-to-analog converter (DAC) apparatus (e.g., 501, 1350, 1351, 200, 500, 1300) includes a first DAC system (e.g., 202, 203, 1321, 1322, 1323, 1324) comprising a first sub-DAC system (e.g., 231*a*, 231*b*, 232*a*, 232*b*) and a second sub-DAC system (e.g., 231*a*, 231*b*, 232*a*, 232*b* that is associated with, but not, the first sub-DAC system); a second DAC system (e.g., 202, 203, 1321, 1322, 1323, or 1324 that is associated with, but not, the first DAC system) comprising a third sub-DAC system (e.g., 231*a*, 231*b*, 232*a*, 232*b* that is not the first or second sub-DAC system) and a fourth sub-DAC system (e.g., 231*a*, 231*b*, 232*a*, 232*b* that is associated with, but not, the third sub-DAC system); and a power combiner network (e.g., 206, 1330, 1335) comprising a first input node, a second input node, and an output node. The first power combiner network is coupled to the first DAC system at the first input node and coupled to the second DAC system at the second input node. The first DAC system comprises a first transmission line coupled to the first and second sub-DAC systems and the first power combiner network, wherein the first transmission line (e.g., 430*p*, 430*n***) has a length greater than 10 microns. The second DAC system comprises a second transmission line coupled to the third and fourth sub-DAC systems and the first power combiner network, wherein the second transmission line has a length greater than 10 microns. The first DAC system is configured to generate a first interleaved analog signal, based on a first analog signal from the first sub-DAC system and a second analog signal from the second sub-DAC system. The second DAC system is configured to generate, a second interleaved analog signal, based on a third analog signal from the third sub-DAC system and a fourth analog signal from the fourth sub-DAC system. The power combiner network is configured to combine, without interleaving, the first interleaved analog signal received via the first transmission line and the second interleaved analog signal received via the second transmission line, and output a combined analog signal. An impedance of the first DAC system at the first input node is configured to match an impedance of the power combiner network at the first input node. An impedance of the second DAC system at the second input node is configured to match an impedance of the power combiner network at the second input node, and an impedance of the power combiner network at the output node is configured to match an impedance of a load at the output node.

Clause I: The DAC apparatus of any of the clauses, wherein the first sub-DAC system and the third sub-DAC system are configured to provide partially overlapping sampling clock signals.

Clause J: The DAC apparatus of any of the clauses, wherein the first sub-DAC system and the third sub-DAC system are configured to provide carved quadrature clock signals.

Clause K: The DAC apparatus of any of the clauses, wherein the first sub-DAC system comprises a DAC driver circuit comprising multiple DAC unit cells, wherein the multiple DAC unit cells are positioned laterally adjacent to each other, located along the length of the first transmission line, and coupled to the first transmission line, and wherein the length of the first transmission line is based on the number of the multiple DAC unit cells.

Clause L: The DAC apparatus of any of the clauses, wherein the number of the multiple DAC unit cells are based on a number of input bits of the DAC driver circuit, and wherein when the DAC driver circuit is an N-bit DAC driver circuit, the number of the multiple DAC units cells is greater than or equal to N, where N is an integer greater than 1.

Clause M: The DAC apparatus of any of the clauses, wherein the power combiner network comprises passive components without active components and is configured to operate in voltage-mode.

Clause N: The DAC apparatus of any of the clauses, wherein the first transmission line is coupled to an array of load resistors to covert a current-mode operation to a voltage-mode operation and to provide a matching impedance to the power combiner network.

Clause O: The DAC apparatus of any of the clauses includes a third transmission line that is located between and coupled to the first transmission line and the power combiner network, the third transmission line having a length greater than 0.5 millimeters.

Clause P: The DAC apparatus of any of the clauses, wherein the length of the first transmission line is greater than 50 microns.

Clause Q: The DAC apparatus of any of the clauses, wherein the length of the first transmission line is based on the number of input bits of the DAC driver circuit.

Clause R: A method of convening digital-to-analog (DAC) signals utilizing a DAC apparatus comprising a first DAC system, a second DAC system and a power combiner, wherein the first DAC system comprises a first sub-DAC system and a second sub-DAC system, wherein the second DAC system comprises a third sub-DAC system and a fourth sub-DAC system, wherein the power combiner comprises a first input node, a second input node, and an output node, the method includes generating at the first DAC system, a first interleaved analog signal, based on a first analog signal from the first sub-DAC system and a second analog signal from the second sub-DAC system, wherein the first and second analog signals are based on first and second digital signals, respectively. The method also includes generating at the second DAC system, a second interleaved analog signal, based on a third analog signal from the third sub-DAC system and a fourth analog signal from the fourth sub-DAC system, wherein the third and fourth analog signals are based on third and fourth digital signals, respectively. The method also includes combining, at the power combiner without interleaving, the first interleaved analog signal and the second interleaved analog signal. The method also includes combining, at the power combiner without interleaving, the first interleaved analog signal and the second interleaved analog signal. An impedance of the first DAC system at the first input node matches an impedance of the power combiner at the first input node. An impedance of the second DAC system at the second input node matches an impedance of the power combiner at the second input node. An impedance of the power combiner at the output node matches an impedance of a load at the output node.

Clause S: The method of any of the clauses, wherein a DAC driver circuit of each of the first and second sub-DAC systems operates at a clock frequency of 10 GHz or higher, and each of the first and second DAC systems comprises a transmission line which is coupled to the power combiner and has a length greater than or equal to 20 microns.

Clause T: The method of any of the clauses, wherein the first and second DAC systems operate in a current-mode, and the power combiner operate in a voltage mode.

In one or more aspects, examples of additional clauses are described below.

A method comprising one or more methods, operations or portions thereof described herein.

An apparatus comprising means adapted for performing one or more methods, operations or portions thereof described herein.

A hardware apparatus comprising circuits configured to perform one or more methods, operations or portions thereof described herein.

An apparatus comprising means adapted for performing one or more methods, operations or portions thereof described herein.

An apparatus comprising components operable to carry out one or more methods, operations or portions thereof described herein.

In one aspect, a method may be an operation, an instruction, or a function and vice versa. In one aspect, a clause or claim may be amended to include some or all of the words (e.g., instructions, operations, functions, or components) recited in other one or more clauses, one or more claims, one or more words, one or more sentences, one or more phrases, and one or more paragraphs.

To illustrate the interchangeability of hardware and software, items such as the various illustrative blocks, modules, components, methods, operations, instructions, and algorithms have been described generally in terms of their functionality. Whether such functionality is implemented as hardware, software or a combination of hardware and software depends upon the particular application and design constraints imposed on the overall system. Skilled artisans may implement the described functionality in varying ways for each particular application.

A reference to an element in the singular is not intended to mean one and only one unless specifically so stated, but rather one or more. For example, "a" module may refer to one or more modules. An element proceeded by "a," "an," "the," or "said" does not, without further constraints, preclude the existence of additional same elements.

Headings and subheadings, if any, are used for convenience only and do not limit the invention. The word exemplary is used to mean serving as an example or illustration. To the extent that the term include, have, or the like is used, such term is intended to be inclusive in a manner similar to the term comprise as comprise is interpreted when employed as a transitional word in a claim. Relational terms such as first and second and the like may be used to distinguish one entity or action from another without necessarily requiring or implying any actual such relationship or order between such entities or actions.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect or some aspects may refer to one or more aspects and vice versa, and this applies similarly to other foregoing phrases.

A phrase "at least one of" preceding a series of items, with the terms "and" or "or" to separate any of the items, modifies the list as a whole, rather than each member of the list. The phrase "at least one of" does not require selection of at least one item; rather, the phrase allows a meaning that includes at least one of any one of the items, and/or at least one of any combination of the items, and/or at least one of each of the items. By way of example, each of the phrases "at least one of A, B, and C" or "at least one of A, B, or C" refers to only A, only B, or only C; any combination of A, B, and C; and/or at least one of each of A, B, and C.

In one aspect, a transistor may be a bipolar junction transistor (BJT), and it may refer to any of a variety of multi-terminal transistors generally operating on the principal of carrying current using both electrons and holes, including but not limited to an n-p-n BJT and a p-n-p BJT.

In one aspect, a transistor may be a field effect transistor (FET), and it may refer to any of a variety of multi-terminal transistors generally operating on the principals of controlling an electric field to control the shape and hence the conductivity of a channel of one type of charge carrier in a semiconductor material, including, but not limited to a metal oxide semiconductor field effect transistor (MOSFET), a junction FET (JFET), a metal semiconductor FET (MESFET), a high electron mobility transistor (HEMT), a modulation doped FET (MODFET), an insulated gate bipolar transistor (IGBT), a fast reverse epitaxial diode FET (FREDFET), and an ion-sensitive FET (ISFET).

In one aspect, the terms base, emitter, and collector may refer to three terminals of a transistor and may refer to a base, an emitter and a collector of a bipolar junction transistor or may refer to a gate, a source, and a drain of a field effect transistor, respectively, and vice versa. In another aspect, the terms gate, source, and drain may refer to base, emitter, and collector of a transistor, respectively, and vice versa.

Unless otherwise mentioned, various configurations described in the present disclosure may be implemented on a Silicon, Silicon-Germanium (SiGe), Gallium Arsenide (GaAs), Indium Phosphide (InP) or Indium Gallium Phosphide (InGaP) substrate, or any other suitable substrate.

It is understood that the specific order or hierarchy of steps, operations, or processes disclosed is an illustration of exemplary approaches. Unless explicitly stated otherwise, it is understood that the specific order or hierarchy of steps, operations, or processes may be performed in different order. Some of the steps, operations, or processes may be performed simultaneously. The accompanying method claims, if any, present elements of the various steps, operations or processes in a sample order, and are not meant to be limited to the specific order or hierarchy presented. These may be performed in serial, linearly, in parallel or in different order. It should be understood that the described instructions, operations, and systems can generally be integrated together in a single software/hardware product or packaged into multiple software/hardware products.

In one aspect, a term coupled or the like may refer to being directly coupled. In another aspect, a term coupled or the like may refer to being indirectly coupled.

Terms such as top, bottom, front, rear, side, horizontal, vertical, and the like refer to an arbitrary frame of reference, rather than to the ordinary gravitational frame of reference. Thus, such a term may extend upwardly, downwardly, diagonally, or horizontally in a gravitational frame of reference.

The disclosure is provided to enable any person skilled in the art to practice the various aspects described herein. In some instances, well-known structures and components are shown in block diagram form in order to avoid obscuring the concepts of the subject technology. The disclosure provides various examples of the subject technology, and the subject technology is not limited to these examples. Various modifications to these aspects will be readily apparent to those skilled in the art, and the principles described herein may be applied to other aspects.

All structural and functional equivalents to the elements of the various aspects described throughout the disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for".

The title, background, brief description of the drawings, abstract, and drawings are hereby incorporated into the disclosure and are provided as illustrative examples of the disclosure, not as restrictive descriptions. It is submitted with the understanding that they will not be used to limit the scope or meaning of the claims. In addition, in the detailed description, it can be seen that the description provides illustrative examples and the various features are grouped together in various implementations for the purpose of streamlining the disclosure. The method of disclosure is not to be interpreted as reflecting an intention that the claimed subject matter requires more features than are expressly recited in each claim. Rather, as the claims reflect, inventive subject matter lies in less than all features of a single disclosed configuration or operation. The claims are hereby incorporated into the detailed description, with each claim standing on its own as a separately claimed subject matter.

The claims are not intended to be limited to the aspects described herein, but are to be accorded the full scope consistent with the language claims and to encompass all legal equivalents. Notwithstanding, none of the claims are intended to embrace subject matter that fails to satisfy the requirements of the applicable patent law, nor should they be interpreted in such a way.

What is claimed is:

1. A digital-to-analog converter (DAC) apparatus for a ultra-high speed operation having a full sampling frequency of 2 GHz or higher for interleaving data using multiple sub-DAC systems, followed by combining the interleaved data using a power combiner network without interleaving, the DAC apparatus comprising:
   one or more digital pre-coders configured to process digital signals;
   a plurality of DAC modules coupled to the one or more digital pre-coders, each of the plurality of DAC modules comprising:
      a first current-mode DAC system comprising a first sub-DAC system and a second sub-DAC system;
      a second current-mode DAC system comprising a third sub-DAC system and a fourth sub-DAC system; and
      a first power combiner network comprising a first input node, a second input node, and an output node, wherein the first power combiner network is coupled to the first current-mode DAC system at the first input node and coupled to the second current-mode DAC system at the second input node,
   wherein:
      the first current-mode DAC system comprises a first transmission line coupled to the first and second sub-DAC systems and the first power combiner network, wherein the first transmission line has a length greater than 10 microns,
      the second current-mode DAC system comprises a second transmission line coupled to the third and fourth sub-DAC systems and the first power combiner network, wherein the second transmission line has a length greater than 10 microns,
      the first current-mode DAC system is configured to generate, a first interleaved analog signal, based on a first analog signal from the first sub-DAC system and a second analog signal from the second sub-DAC system,
      the second current-mode DAC system is configured to generate, a second interleaved analog signal, based on a third analog signal from the third sub-DAC system and a fourth analog signal from the fourth sub-DAC system,
      the first power combiner network is configured to combine, without interleaving, the first interleaved analog signal received via the first transmission line and the second interleaved analog signal received via the second transmission line, and output a combined analog signal,
      an impedance of the first current-mode DAC system at the first input node is configured to match an impedance of the first power combiner network at the first input node,
      an impedance of the second current-mode DAC system at the second input node is configured to match an impedance of the first power combiner network at the second input node, and
      an impedance of the first power combiner network at the output node is configured to match an impedance of a load at the output node; and
   a second power combiner network comprising a third input node, a fourth input node, and a second output node, wherein the second power combiner network is coupled to the first power combiner network of each of at least two of the plurality of DAC modules,
   wherein:
      the second power combiner network is configured to combine, without interleaving, the combined analog signals from at least two of the plurality of DAC modules,
      an impedance of a first one of the plurality of DAC modules at the third input node is configured to match an impedance of the second power combiner network at the third input node,
      an impedance of a second one of the plurality of DAC modules at the fourth input node is configured to match an impedance of the second power combiner network at the fourth input node, and
      an impedance of the second power combiner network at the second output node is configured to match an impedance of a load at the second output node.

2. The DAC apparatus of claim 1, wherein the first sub-DAC system comprises a clock generator circuit and a DAC driver circuit, the clock generator circuit configured to provide a clock signal to the DAC driver circuit at a frequency equal to or greater than 10 GHz.

3. The DAC apparatus of claim 2, wherein the first sub-DAC system comprises a multiplexer, the multiplexer configured to receive a plurality of clock signals from the clock generator circuit, wherein a frequency of each of the plurality of clock signals is less than the frequency of the clock signal provided to the DAC driver circuit.

4. The DAC apparatus of claim 2, wherein the DAC driver circuit comprises a plurality of DAC unit cells, wherein the plurality of DAC unit cells are positioned adjacent to each other, located along the length of the first transmission line, and coupled to the first transmission line.

5. The DAC apparatus of claim 4, wherein the length of the first transmission line is based on the number of the plurality of DAC unit cells.

6. The DAC apparatus of claim 1, wherein the second power combiner network comprises passive components without active components.

7. The DAC apparatus of claim 1, wherein each of the first power combiner network and the second power combiner network is configured to operate in voltage-mode.

8. A digital-to-analog converter (DAC) apparatus, comprising:
- a first DAC system comprising a first sub-DAC system and a second sub-DAC system;
- a second DAC system comprising a third sub-DAC system and a fourth sub-DAC system; and
- a power combiner network comprising a first input node, a second input node, and an output node;
- wherein the power combiner network is coupled to the first DAC system at the first input node and coupled to the second DAC system at the second input node, wherein:
- the first DAC system comprises a first transmission line coupled to the first and second sub-DAC systems and the power combiner network, wherein the first transmission line has a length greater than 10 microns,
- the second DAC system comprises a second transmission line coupled to the third and fourth sub-DAC systems and the power combiner network, wherein the second transmission line has a length greater than 10 microns,
- the first DAC system is configured to generate a first interleaved analog signal, based on a first analog signal from the first sub-DAC system and a second analog signal from the second sub-DAC system,
- the second DAC system is configured to generate, a second interleaved analog signal, based on a third analog signal from the third sub-DAC system and a fourth analog signal from the fourth sub-DAC system,
- the power combiner network is configured to combine, without interleaving, the first interleaved analog signal received via the first transmission line and the second interleaved analog signal received via the second transmission line, and output a combined analog signal,
- an impedance of the first DAC system at the first input node is configured to match an impedance of the power combiner network at the first input node,
- an impedance of the second DAC system at the second input node is configured to match an impedance of the power combiner network at the second input node, and
- an impedance of the power combiner network at the output node is configured to match an impedance of a load at the output node.

9. The DAC apparatus of claim 8, wherein the first sub-DAC system and the third sub-DAC system are configured to provide partially overlapping sampling clock signals.

10. The DAC apparatus of claim 8, wherein the first sub-DAC system and the third sub-DAC system are configured to provide carved quadrature clock signals.

11. The DAC apparatus of claim 8, wherein the first sub-DAC system comprises a DAC driver circuit comprising a plurality of DAC unit cells, wherein the plurality of DAC unit cells are positioned laterally adjacent to each other, located along the length of the first transmission line, and coupled to the first transmission line, and wherein the length of the first transmission line is based on the number of the plurality of DAC unit cells.

12. The DAC apparatus of claim 11, wherein the number of the plurality of DAC unit cells is based on a number of input bits of the DAC driver circuit, and wherein when the DAC driver circuit is an N-bit DAC driver circuit, the number of the plurality of DAC units cells is greater than or equal to N, where N is an integer greater than 1.

13. The DAC apparatus of claim 11, wherein the length of the first transmission line is based on the number of input bits of the DAC driver circuit.

14. The DAC apparatus of claim 8, wherein the power combiner network comprises passive components without active components and is configured to operate in voltage-mode.

15. The DAC apparatus of claim 8, wherein the first transmission line is coupled to an array of load resistors to covert a current-mode operation to a voltage-mode operation and to provide a matching impedance to the power combiner network.

16. The DAC apparatus of claim 8, comprises:
- a third transmission line that is located between and coupled to the first transmission line and the power combiner network, the third transmission line having a length greater than 0.5 millimeters.

17. The DAC apparatus of claim 8, wherein the length of the first transmission line is greater than 50 microns.

18. A method of converting digital-to-analog (DAC) signals utilizing a DAC apparatus comprising a first DAC system, a second DAC system and a power combiner, wherein the first DAC system comprises a first sub-DAC system and a second sub-DAC system, wherein the second DAC system comprises a third sub-DAC system and a fourth sub-DAC system, wherein the power combiner comprises a first input node, a second input node, and an output node, the method comprising:
- generating at the first DAC system, a first interleaved analog signal, based on a first analog signal from the first sub-DAC system and a second analog signal from the second sub-DAC system, wherein the first and second analog signals are based on first and second digital signals, respectively;
- generating at the second DAC system, a second interleaved analog signal, based on a third analog signal from the third sub-DAC system and a fourth analog signal from the fourth sub-DAC system, wherein the third and fourth analog signals are based on third and fourth digital signals, respectively;
- combining, at the power combiner without interleaving, the first interleaved analog signal and the second interleaved analog signal; and
- outputting, at the power combiner, a combined analog signal without interleaving, wherein:
- an impedance of the first DAC system at the first input node matches an impedance of the power combiner at the first input node, an impedance of the second DAC system at the second input node matches an impedance of the power combiner at the second input node, and an impedance of the power combiner at the output node matches an impedance of a load at the output node.

19. The method of claim 18, wherein a DAC driver circuit of each of the first and second sub-DAC systems operates at a clock frequency of 10 GHz or higher, and each of the first and second DAC systems comprises a transmission line which is coupled to the power combiner and has a length greater than or equal to 20 microns.

20. The method of claim 19, wherein the first and second DAC systems operate in a current-mode, and the power combiner operate in a voltage mode.

* * * * *